US011330712B2

(12) United States Patent
Akejima

(10) Patent No.: US 11,330,712 B2
(45) Date of Patent: May 10, 2022

(54) ELECTRONIC CIRCUIT DEVICE AND METHOD OF MANUFACTURING ELECTRONIC CIRCUIT DEVICE

(71) Applicant: RISING TECHNOLOGIES CO., LTD., Yokohama (JP)

(72) Inventor: Shuzo Akejima, Yokohama (JP)

(73) Assignee: RISING TECHNOLOGIES CO., LTD., Yokohama (JP)

( * ) Notice: Subject to any disclaimer, the term of this patent is extended or adjusted under 35 U.S.C. 154(b) by 0 days.

(21) Appl. No.: 17/107,596

(22) Filed: Nov. 30, 2020

(65) Prior Publication Data

US 2021/0084762 A1 Mar. 18, 2021

Related U.S. Application Data

(63) Continuation of application No. PCT/JP2020/009810, filed on Mar. 6, 2020.

(30) Foreign Application Priority Data

Apr. 12, 2019 (JP) .............................. JP2019-076624

(51) Int. Cl.
*H05K 1/11* (2006.01)
*H05K 1/03* (2006.01)
(Continued)

(52) U.S. Cl.
CPC ........... *H05K 1/115* (2013.01); *H05K 1/0393* (2013.01); *H05K 3/4038* (2013.01); *H05K 3/4644* (2013.01); *H05K 2201/10734* (2013.01)

(58) Field of Classification Search
CPC .... H05K 1/115; H05K 1/0393; H05K 3/4038; H05K 3/4644; H05K 1/185; H05K 2201/10734
(Continued)

(56) References Cited

U.S. PATENT DOCUMENTS 6,803,324 B2 10/2004 Ogawa et al.
7,514,636 B2 4/2009 Sasaki
(Continued)

FOREIGN PATENT DOCUMENTS

CN 108780791 A 11/2018
EP 3339023 A1 6/2018
(Continued)

OTHER PUBLICATIONS

Office Action dated Jan. 14, 2021 issued in TW Appl. No. 109112166., English translation attached.
(Continued)

*Primary Examiner* — Sherman Ng
(74) *Attorney, Agent, or Firm* — Franklin & Associates International Inc; Matthew Lambrinos

(57) ABSTRACT

An electronic circuit device according to the present invention includes a base substrate having a wiring layer, at least one first electronic circuit element having a first surface fixed to the base substrate and having a connection part on a second surface opposed to the first surface, a re-distribution layer including a photosensitive resin layer, the photosensitive resin layer enclosing the first electronic circuit element on the base substrate and embedding a first wiring photo via, a second wiring photo via, and a wiring, the first wiring photo via electrically connected to the connection part of the first electronic circuit element, the second wiring photo via arranged at the outer periphery of the first electronic circuit element and electrically connected to a connection part of the wiring layer, the wiring arranged on the second surface and electrically connected to the first wiring photo via and the second wiring photo via.

16 Claims, 25 Drawing Sheets

(51) Int. Cl.
  *H05K 3/40* (2006.01)
  *H05K 3/46* (2006.01)
(58) Field of Classification Search
  USPC .................................................... 174/261
  See application file for complete search history.

(56) References Cited

U.S. PATENT DOCUMENTS

| | | | |
|---|---|---|---|
| 8,643,164 | B2 | 2/2014 | Kaufmann et al. |
| 9,318,429 | B2 | 4/2016 | Hu et al. |
| 9,595,482 | B2 | 3/2017 | Chen |
| 10,354,964 | B2 | 7/2019 | Yu et al. |
| 2005/0017346 | A1 | 1/2005 | Yamagata |
| 2007/0052067 | A1 | 3/2007 | Umemoto |
| 2009/0000114 | A1 | 1/2009 | Rao et al. |
| 2010/0213599 | A1 | 8/2010 | Watanabe et al. |
| 2012/0300425 | A1 | 11/2012 | Nakashima et al. |
| 2013/0157419 | A1 | 6/2013 | Shimizu et al. |
| 2015/0016079 | A1* | 1/2015 | Furutani ............. H01L 24/19 361/763 |
| 2015/0179616 | A1 | 6/2015 | Lin et al. |
| 2015/0194388 | A1 | 7/2015 | Pabst et al. |
| 2015/0259194 | A1 | 9/2015 | Lin et al. |
| 2016/0276307 | A1 | 9/2016 | Lin et al. |
| 2017/0025380 | A1 | 1/2017 | Zhai et al. |
| 2017/0287874 | A1 | 10/2017 | Fang et al. |
| 2018/0130745 | A1* | 5/2018 | Hu ..................... H01L 23/5384 |
| 2019/0043835 | A1 | 2/2019 | Lee et al. |
| 2019/0378801 | A1* | 12/2019 | Leitgeb .............. H01L 23/66 |
| 2021/0005555 | A1 | 1/2021 | Akejima |
| 2021/0082828 | A1 | 3/2021 | Akejima |

FOREIGN PATENT DOCUMENTS

| | | |
|---|---|---|
| JP | 11233678 A | 8/1999 |
| JP | 2005183548 A | 7/2005 |
| JP | 2007067216 A | 3/2007 |
| JP | 2010219489 A | 9/2010 |
| JP | 2013128060 A | 6/2013 |
| JP | 2013236105 A | 11/2013 |
| JP | 2015056458 A | 3/2015 |
| JP | 2019033245 A | 2/2019 |
| TW | 606563 B | 11/2017 |
| WO | 2010101163 A1 | 9/2010 |
| WO | 2019049899 A1 | 3/2019 |
| WO | 2020/230442 | 11/2020 |

OTHER PUBLICATIONS

Chien-Fu Tseng, Chung-Shi Liu, Chi-Hsi Wu, and Douglas Yu, "InFO (Wafer Level Integrated Fan-Out) Technology", 2016 IEEE 66th Electronic Components and Technology Conference, USA, Electronic Components and Technology Conference, 2016, DOI 10.1109/ECTC.2016.65, Cited in the specification of PCT/JP2020/009810.
ISR for PCT/JP2020/009810, dated Jun. 23, 2020, English translation attached.
WO-ISA for PCT/JP2020/009810, dated Jun. 23, 2020.
ISR for PCT/JP2018/032904, dated Oct. 30, 2018, English translation attached.
WO-ISA for PCT/JP2018/032904, dated Oct. 30, 2018, English translation attached.
U.S. Appl. No. 17/107,806, filed Nov. 30, 2020, in the name of Rising Technologies Co., Ltd. and entitled "Electronic Circuit Device and Method of Manufacturing Electronic Circuit Device".
ISR for PCT/JP2020/011640, dated May 26, 2020, English translation attached.
WO-ISA for PCT/JP2020/011640, dated May 26, 2020.
Specification of PCT/JP2020/022096.
Masaaki Ishida et al., "Electromagnetic Shielding Technologies for Semiconductor Packages" Toshiba review, pp. 7p-10p, vol. 2, 2012, Cited in the specification of PCT/JP2020/022096 English machine translation attached.
Sheng-Chi Hsieh, Fu-Cheng Chu, Cheng-Yu Ho and Chen-Chao Wang, "Advanced Thin-Profile Fan-Out with Beamforming Verification for 5G WidebandAntenna", 2019 IEEE 69th Electronic Components and Technology Conference, USA, Electronic Components and Technology Conference, 2019, DOI 10.1109/ECTC. 2019.00153, Cited in the specification of PCT/JP2020/022096.
ISR for PCT/JP2020/022096, dated Sep. 8, 2020.
WO-ISA for PCT/JP2020/022096, dated Sep. 8, 2020.
Office Action dated Apr. 19, 2021 issued in Co-pending U.S. Appl. No. 16/812,268.
English translation of WO-ISA(ISA237) for PCT/JP2020/009810 dated Jun. 23, 2020. The original Japanese document was submitted in IDS of Dec. 1, 2020.
English translation of WO-ISA(ISA237) for PCT/JP2020/011640 dated May 26, 2020. The original Japanese document was submitted in IDS of Dec. 1, 2020.
English translation of ISR(ISA210) for PCT/JP2020/022096 dated Sep. 8, 2020. The original Japanese document was submitted in IDS of Dec. 1, 2020.
English translation of WO-ISA(ISA237) for PCT/JP2020/022096 dated Sep. 8, 2020. The original Japanese document was submitted in IDS of Dec. 1, 2020.
Office Action dated Jan. 14, 2022 issued in US Co-pending U.S. Appl. No. 17/107,806.
Office Action dated Jan. 24, 2022 issued in TW Appl. No.107131562.

* cited by examiner

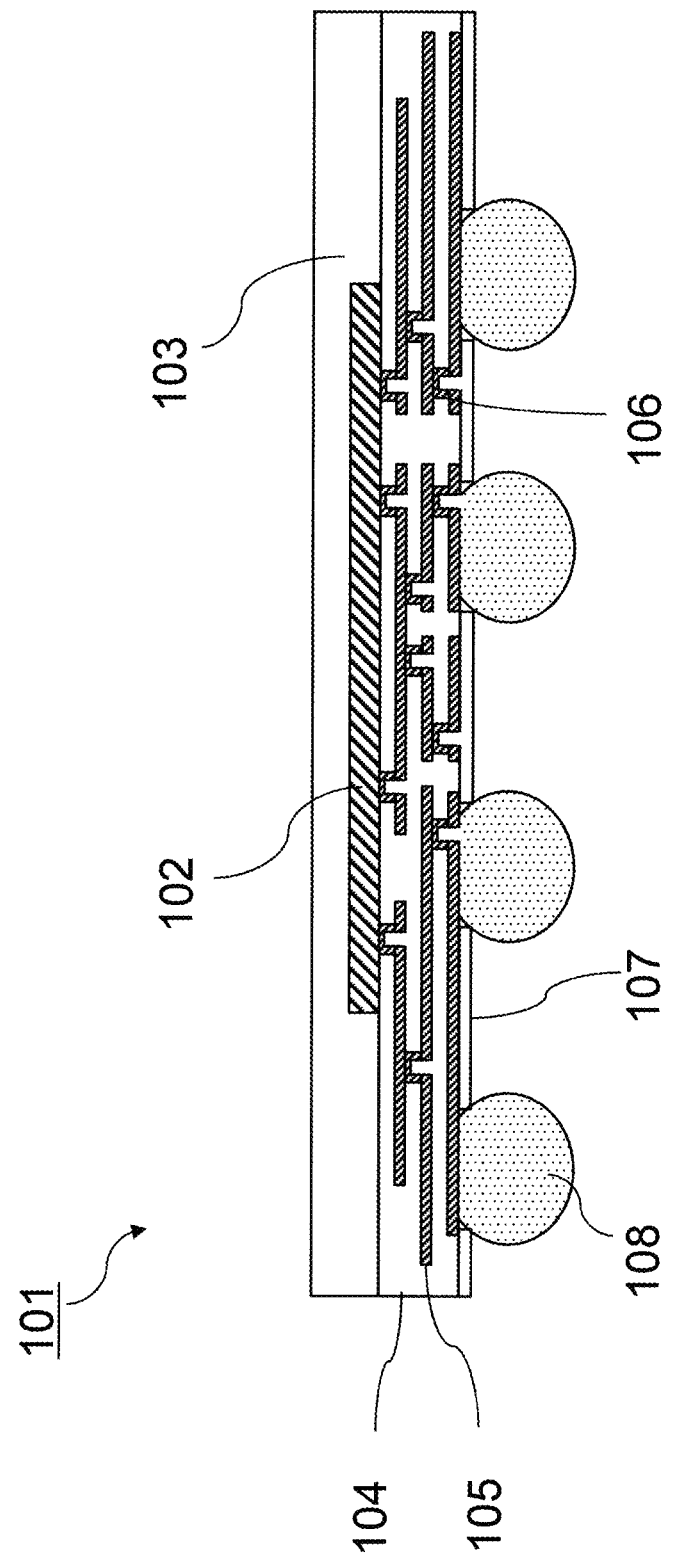

ELECTRONIC CIRCUIT DEVICE AND METHOD OF MANUFACTURING ELECTRONIC CIRCUIT DEVICE

CROSS REFERENCE TO RELATED APPLICATIONS

This application is a continuation application of International Patent Application No. PCT/JP2020/009810, filed on Mar. 6, 2020, and entitled "ELECTRONIC CIRCUIT DEVICE AND METHOD OF MANUFACTURING ELECTRONIC CIRCUIT DEVICE", which is based upon and claims the benefit of priority from the prior Japanese Patent Application No. 2019-076624, filed on Apr. 12, 2019, the entire contents of each of which are incorporated herein by reference.

FIELD

The present invention relates to an electronic circuit device and a method of manufacturing the electronic circuit device. In particular, the present invention relates to an electronic circuit device and a manufacturing method thereof that facilitates three-dimensional mounting by realizing a fan-out wafer-level package (FOWLP) suitable for system integration at low costs.

BACKGROUND

Wafer-level package (WLP) with a low profile while maintaining the same surface area as the surface area of the integrated circuit element (referred to as a semiconductor chip) in which sophisticated integrated circuit is configured and FOWLP having a large number of external connection terminals by making them larger than the surface area of the semiconductor chip have been put into practical use. In a typical Face-Down type FOWLP, a large number of individualized semiconductor chips are temporarily fixed on a wafer-sized (or panel-sized) support material via an adhesive layer by aligning the surfaces on which the integrated circuit are formed (i.e., the surfaces on which the connection terminals are formed) toward the support material at intervals (a process referred to as chip-first). Thereafter, a plurality of mounted semiconductor chips are sealed with an insulating liquid material (cured into a flat plate shape by heat-compression molding so as to cover the back surface of the semiconductor chip), tapes are peeled off, the relocated wiring structure (re-distribution layer) is stacked by performing re-distribution process on the exposed surface on which the integrated circuit is formed (the surface on which the connection terminals are formed), and then the package having a surface area larger than that of the embedded semiconductor chip is individually separated and packaged using a dicing saw. The re-distribution layer structure that draw out wiring from the connection terminals of each exposed semiconductor chip is formed with a fine wiring pitch (on the order of several μm to several tens of μm) using a particular wiring process of the semiconductor process (the manufacturing process of the semiconductor chip). A large number of external connection terminals are arranged in units of packages to be individualized, and solder balls are arranged at each external connection terminals. As a result, re-distribution layer is stacked on the connection surface of the semiconductor chip, and the external connection terminals are arranged on the outer surface of the re-distribution layer.

In the conventional WLP, the number of external connection terminals depends on the surface area of the semiconductor chip, so that the applicable semiconductor chip is limited. On the other hand, the FOWLP can be applied to a logic (Logic) LSI including a micro processor unit (MPU) and a graphic processor unit (GPU) which inputs and outputs multi-bit parallel data at high speed by increasing the size (this logic LSI is an application processor composed of an application specific integrated circuit (ASIC), and is an application processor that operates various applications in a mobile communication terminal or the like, a base band processor for performing digital signal processing of signals related to transmission and reception, and the like).

In the FOWLP, in addition to the above mentioned Face-Down type, there is also a so called Face-Up type. This Face-Up type requires a complicated manufacturing process that requires accuracy. First, Cu pillars are formed perpendicularly on the connection terminals of the surface on which the integrated circuit of each semiconductor wafer is formed, then cut into the semiconductor chip with the dicing saw, and the back surface of each semiconductor chip (the opposite surface of the surface on which the integrated circuit is formed) is fixed to a base substrate (wafer shape or panel shape) with an adhesive material at intervals. Thereafter, the whole is molded using liquid resins so as to cover the semiconductor chip. Next, surface treatment is performed by chemical mechanical polishing (Chemical Mechanical Polishing: CMP) to expose the tip of a plurality of Cu pillars arranged on the semiconductor chip. After the relocated wiring structure (re-distribution layer) is stacked by performing re-distribution process on the exposed surface, the external connection terminals are arranged on the outer surface of the re-distribution layer, and it is individually packaged into packages having a surface area larger than the surface area of the embedded semiconductor chip.

FIG. 25 shows a cross-sectional view of the typical individualized Face-Down type FOWLP 101. The re-distribution layer 104 is stacked (lower in FIG. 25) on the surface on which the integrated circuit of a semiconductor chip 102 molded in a mold resin 103 is formed (the surface on which the connection terminals are formed). That is, the re-distribution layer 104 is formed on the surface on which the connection terminals of the integrated circuit of the semiconductor chip 102 are formed and one surface of the mold resin 103 which is flush with the forming surface.

The re-distribution layer 104 is composed of a multi-layered metal re-distribution 105. Between the metal re-distributions 105 located in the different layers and between the metal re-distribution 105 and the connection terminal of the semiconductor chip 102 are electrically connected by wiring photo via 106.

An insulating layer 107 is selectively formed on the surface of the re-distribution layer 104 opposite to the semiconductor chip 102, and a part of the metal re-distribution 105 is exposed in a region where the insulating layer 107 is not formed. This exposed part serves as the connection terminal (connection pad), and solder balls 108 are formed. The diameter of the solder balls 108 are usually about 200 μm to 350 μm.

The FOWLP 101 configured as described above has a fan-out configuration in which the external connection terminals can be arranged in an area larger than the area of the semiconductor chip 102, and is therefore suitable for the application processor, the base band processor, or the like which requires the large number of external connection terminals. Since it does not require a package substrate, which is a small printed substrate, the package is thin and the wiring length is shortened, so that the inductance and stray capacitance are reduced, and the transmission rate of signals can be increased. The absence of the package substrate is expected to result in lower manufacturing costs.

SUMMARY

An electronic circuit device according to an embodiment of the present invention is characterized in that the electronic circuit device includes a base substrate, at least one first electronic circuit element having a first surface fixed to the base substrate and having a connection part on a second surface opposed to the first surface, a re-distribution layer including a photosensitive resin layer, the photosensitive resin layer having insulation properties, the photosensitive resin layer enclosing the first electronic circuit element on the base substrate and embedding a first wiring photo via and a wiring, the first wiring photo via electrically connected to the connection part of the first electronic circuit element, the wiring arranged on the second surface and electrically connected to the first wiring photo via, and an external connection terminal arranged on the re-distribution layer, the external connection terminal electrically connected to the first electronic circuit element through the first wiring photo via and the wiring. Inside of the first wiring photo via and the second wiring photo via are filled with the photosensitive resin layer, an aspect ratio of the first wiring photo via is smaller than an aspect ratio of the second wiring photo via, and the aspect ratio of the first wiring photo via is 1.5 or less, and the external connection terminal is arranged at a position which does not overlap with an outer peripheral end of the first electronic circuit element.

An electronic circuit device according to an embodiment of the present invention is characterized in that the electronic circuit device includes a base substrate, a re-distribution layer including a photosensitive resin layer, the photosensitive resin layer having insulation properties, the photosensitive resin layer integrally enclosing a plurality of electronic circuit elements on the base substrate and embedding a plurality of wiring photo vias, and a wiring, each of the plurality of electronic circuit elements having a first surface fixed to the base substrate and having a connection part on a second surface opposed to the first surface, the plurality of electronic circuit elements having different element thicknesses, the plurality of wiring photo vias electrically connected to the connection part of the plurality of electronic circuit elements, the wiring arranged so as to be orthogonal to the plurality of wiring photo vias and electrically connected to the plurality of wiring photo vias, and an external connection terminal arranged on the re-distribution layer, the external connection terminal electrically connected to the plurality of electronic circuit element through the plurality of wiring photo vias and the wiring. Inside of the plurality of wiring photo vias are filled with the photosensitive resin layer, an aspect ratio of the plurality of wiring photo vias is 1.5 or less, a length of the wiring photo via connected to the connection part of the electronic circuit element having a small element thickness is larger than a length of the wiring photo via connected to the connection part of the electronic circuit element having a large element thickness, and the external connection terminal is arranged at a position which does not overlap with an outer peripheral end of the plurality of electronic circuit element.

A method of manufacturing an electronic circuit device for packaging an electronic circuit element according to an embodiment of the present invention is characterized in that the method includes fixing a first surface of at least one electronic circuit element to a base substrate (first step), forming a first photosensitive resin layer by covering the electronic circuit element and flattening an upper surface of the first photosensitive resin layer using a film type photosensitive resin thicker than the thickness of the electronic circuit element (second step), curing the first photosensitive resin layer after pre curing the first photosensitive resin layer and forming a via hole exposing a connection part arranged on a second surface of the electronic circuit element opposed to the first surface by selectively irradiating the first photosensitive resin layer other than a region overlapping the outer peripheral end of the electronic circuit element with light (third step), forming a wiring pattern and a metal film together, the wiring pattern arranged on a surface of the first photosensitive resin layer, and the metal film electrically connecting the wiring pattern and the inner surface of the via hole (fourth step), forming a second photosensitive resin on the first photosensitive resin to filling the internal space of the via hole and flattening the upper surface of the second photosensitive resin by stacking a film type photosensitive resin thinner than the first photosensitive resin layer on the first photosensitive resin layer (fifth step), and curing the second photosensitive resin layer and adhering the first photosensitive resin layer and the second photosensitive resin layer after pre curing the second photosensitive resin layer and forming a via hole exposing a part of the wiring pattern by selectively irradiating the second photosensitive resin layer other than a region overlapping the outer peripheral end of the electronic circuit element with light (sixth step).

A method of manufacturing an electronic circuit device for packaging an electronic circuit element according to an embodiment of the present invention is characterized in that the method includes fixing a first surface of at least one electronic circuit element to a base substrate having a wiring layer (first step), forming a first photosensitive resin layer by covering the electronic circuit element and flattening an upper surface of the first photosensitive resin layer using a film type photosensitive resin thicker than the thickness of the electronic circuit element (second step), curing the first photosensitive resin layer after pre curing the first photosensitive resin layer and forming a first via hole and a plurality of second via hole simultaneously by selectively irradiating the first photosensitive resin layer other than a region overlapping the outer peripheral end of the electronic circuit element with light, the first via hole exposing a connection part arranged on a second surface of the electronic circuit element opposed to the first surface, and the plurality of second via hole arranged around the electronic circuit element to expose a connection part of the wiring layer (third step), forming a wiring pattern and a metal film together, the wiring pattern arranged on a surface of the first photosensitive resin layer, and the metal film electrically connecting the wiring pattern, the inner surface of the first via hole, and the inner surface of the second via hole (fourth step), forming a second photosensitive resin on the first photosensitive resin to filling the internal space of the first via hole and the second via hole and flattening the upper surface of the second photosensitive resin by stacking a film type photosensitive resin thinner than the first photosensitive resin layer on the first photosensitive resin layer (fifth step), and curing the second photosensitive resin layer and adhering the first photosensitive resin layer and the second photosensitive resin layer after pre curing the second photosensitive resin layer and forming a via hole exposing a part of the wiring pattern by selectively irradiating the second photosensitive resin layer other than a region overlapping the outer peripheral end of the electronic circuit element with light (sixth step).

BRIEF EXPLANATION OF THE DRAWINGS

FIG. 25 is a cross-sectional view of a FOWLP.

DESCRIPTION OF EMBODIMENTS

Figure 1:
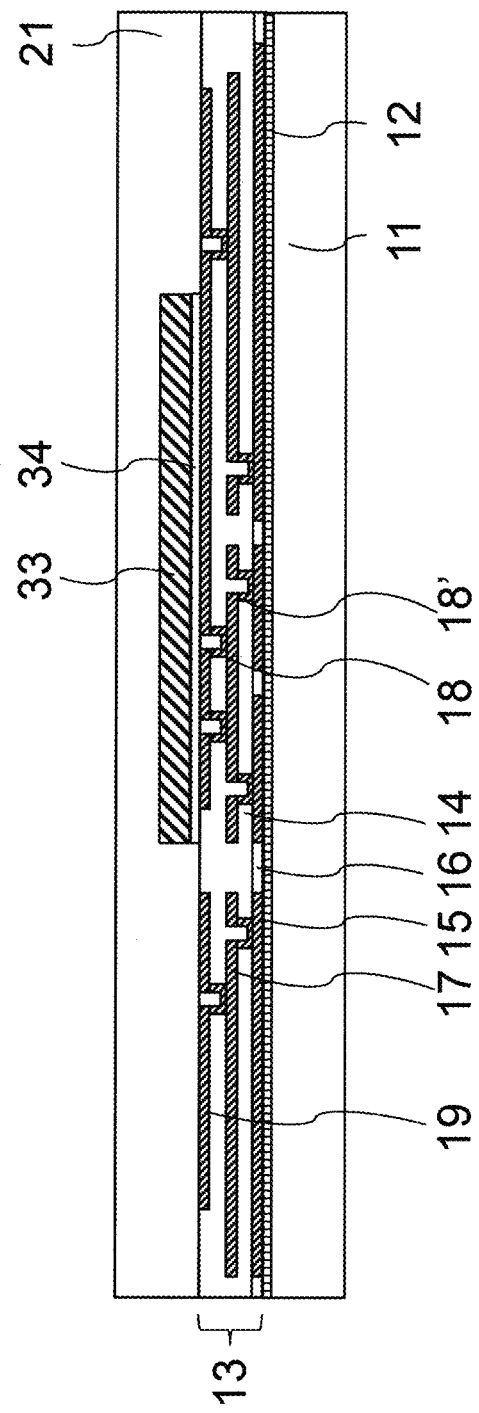
FIG. 1 is a cross-sectional view of a semiconductor device (semi-finished product 1) according to an embodiment of the present invention.

Hereinafter, referring to the drawings, an embodiment of the electronic circuit device and the method of manufacturing electronic information terminal and the electronic circuit device according to the present invention will be described. Here, an exemplary semiconductor device using the semiconducting integrated circuit devices such as an application processor chip is shown as the electronic circuit element. The electronic circuit device and the methods of manufacturing support member of the electronic circuit device and the electronic circuit device can be mounted in many different ways and are not to be construed as being limited to the description of the following embodiments. Note that in the drawings referred to in this embodiment, the same portions are denoted by the same reference numerals, and a repetitive description thereof is omitted.

In the conventional Face-Down type FOWLP 101, a complicated manufacturing process is required in which the plurality of semiconductor chips are arranged to be spaced apart and aligned on the support via the adhesive layer so that the surface on which the circuit is formed (the surface with connection terminal) faces downward, and after resin molding is performed so as to cover the back surface of the semiconductor chip, the support is subjected to a peeling process with high accuracy to-form a layer-form re-distribution layer.

In addition, in the Face-up type FOWLP, a complicated and expensive manufacturing process has been realized in recent years in which the Cu pillars are formed vertically with high precision on the connection terminals of the respective semiconductor chip by using a plating method in advance, the back surfaces of the plurality of semiconductor chips are adhered and fixed on the base substrate at intervals so that the surface on which the circuit is formed (the surface with connection terminal) is on top, and the surface of the resin mold is polished by CMP processing or the like to obtain a single surface after the resin molding to cover the circuit forming the surface of the semiconductor chip (planarization processing), thereby exposing the tip of the Cu pillars and forming the re-distribution layer thereon. In addition, although a manufacturing process has been demonstrated in which the Cu pillars longer than the thickness of the semiconductor chip are provided on the connection terminals of the wiring layer in the base substrate where the wiring layer is provided, the semiconductor chip in which the Cu pillars are provided on the connection terminal of the semiconductor chip is fixed between the pillars on the base substrate, both are molded and subjected to the CMP processing, and the Cu pillars on the base substrate and the Cu pillars extending from the base substrate are electrically connected to the re-distribution layer, the alignment accuracy and the like are further required, resulting in a complicated and expensive three-dimensional FOWLP.

In addition, as the number of long Cu pillars formed from the wiring layer of the base substrate increases, it is not easy to maintain the accuracy of the connection position, resulting in a decrease in the yield in manufacturing the FOWLP, and further increase in costs becomes a problem. In addition, the contact resistance between the Cu pillars and the metal wiring layer in the re-distribution layer also hinders the high-speed.

Further, particularly when different kinds of the semiconductor chip have different thicknesses, it has been investigated that different kinds of the semiconductor chip are juxtaposed by forming the Cu pillars having different lengths on the connection terminal of the thin semiconductor chip to absorb the difference in height between the connection terminal of the thick semiconductor chip and resin-molding, but the same problem as the above mentioned three-dimensional connection has not been solved.

On the other hand, inexpensive system integration of the semiconductor chip using a FOWLP structure is desired, and for example, three-dimensionalization in which two semiconductor chips are stacked or two different types of semiconductor chips are juxtaposed is desired to be realized inexpensively. This is because the mounting area can be reduced even though the thickness of the semiconductor package is increased by about several hundred μm by three-dimensionalization. In particular, the application processor does not operate on its own, but operates by externally attaching large capacity dynamic random access memory (DRAM) or flash memory (Flash memory). It is desirable for the application processor to communicate a large amount of data over a wide data bus with non-specific standard packages of DRAM and Flash memories that have been stacked. In addition, the realization of the juxtaposition of the different types of semiconductor chips allows to easily mounting a plurality of chips with flexibility in the FOWLP structure, and therefore, it is expected that the scope of application as a single module which can easily meet customers and marketing requirements can be expanded.

Accordingly, the present invention provides an inexpensive FOWLP structure and manufacturing method suitable for the system integration of the semiconductor chip, thereby solve the problems of high costs and hindrance of high speeds even in three-dimensionalization by stacking chips and juxtaposition of chips.

<Semi-Finished Product 1>

FIG. 1 is a cross-sectional view of a semiconductor device 10 according to an embodiment of the present invention. The semiconductor device 10 is a semi-finished product on a temporary wafer or a temporary panel, and the left and right ends in the drawing are connected to the semiconductor device 10 having the same configuration and are to be individualized in a later step.

The semiconductor device 10 is composed of the base substrate, an application processor chip (semiconductor element, first electronic circuit element) 33 FACE-UP mounted on a wiring layer 13 in the base substrate, and a film type photosensitive resin 21 enclosing the application processor. Although not shown in the drawings, when the semiconductor device 10 is distributed, a protective sheet (film) covering the surfaces of the photosensitive resin layer 21 may be attached for device protection and light shielding. The thickness of the application processor chip 33 is about 70 μm, and the thickness of the photosensitive resin layer 21 is about 100 μm.

As shown in FIG. 1, in this embodiment, the base substrate includes a substrate 11, a release layer 12 formed on the substrate 11, and a wiring layer 13 formed on the release layer 12. The wiring layer 13 has a thickness of about 30 μm to 50 μm and a multilayered wiring structure (three layers are shown in the figure, but the number of layers is not limited).

The substrate 11 may be a substrate such as a glasses or plastics having translucency and rigidity, or a substrate of a silicone, a metal, or a non-transparent plastic. The substrate 11 is circular or rectangular in a planar view from 0.5 inches to 12 inches. In the manufacturing process based on the semiconductor wafer size, it is typically a 12-inch circle. Since the application processor chip 33 has a rectangular shape of several millimeters to several centimeters square, several tens to several thousands of application processor chips 33 can be packaged simultaneously by using one substrate 11. In order to simultaneously form a larger number of packages (pieces), a rectangular liquid crystal substrate having a long side of 12 inches or more can be used in the manufacturing process.

The release layer 12 is formed on the substrate 11. The material of the release layer 12 is an adhesive layer and a pure release layer. The adhesive layer is composed of a polyethylene terephthalate layer having a thickness of about 10 micrometers. The pure release layer is desirably composed of a polymer compound layer composed of a hydroxyl group and a light absorbing group having a thickness of 1 μm or less, typically about 0.3 μm. The total thickness is from a few μm to a few tens of μm, typically about 10 μm. The reason why the pure release layer is composed of the polymer compound layer composed of the hydroxyl group and the light absorbing group is that it is later released by irradiating a laser beam. The reason why the adhesive layer is formed is to protect the application processor chip 33 from being irradiated with the laser beam. In addition to the peeling by the laser light irradiation, mechanical peeling can be performed. In this case, the light absorbing group is unnecessary for the peeling layer.

The wiring layer 13 includes multi-layer copper wiring layers 15, 17, 19 and an insulating film 14 covering the multi-layer copper wiring layers 15, 17, 19. The copper wiring layer 19 is connected to the copper wiring layer 17 through a via 18. An insulating layer 16 composes of a solder-resist or other insulating film is formed on the release layer 12 in contact with the release layer 12. The part where the insulating layer 16 does not exist is the copper wiring layer 15 and functions as the connection pad (hereinafter also referred to as a connection pad 15). A patterned copper wiring layer 17 is formed on the copper wiring layer 15 and the insulating layer 16. The copper wiring layer 17 is connected to the copper wiring layer 15 through a via 18'. The part where the insulating layer 16 does not exist becomes the connection pad 15, and a nickel layer or a gold layer may be formed on this part. The copper wiring layer 17 is covered with the insulating film 14. The insulating film 14 is made of insulating materials (e.g., polyimides, epoxies) used in an interlayer insulating film of the semiconductor device. A patterned copper wiring layer 19 is formed on the upper layer of the copper wiring layer 17, the copper wiring layers 15 and 17 are connected through the via 18', and the copper wiring layers 17 and 19 are connected through the via 18. The via 18 and the via 18' may be either a photo via that forms a metal layer in a through hole subjected to opening by selectively irradiating UV rays or a laser via that forms a metal layer in a through hole subjected to opening by selectively irradiating a laser. The via 18 is made of the copper wiring integrally with the copper wiring layer 19. The via 18' is made of the copper wiring integrally with the copper wiring layer 17. Like the copper wiring layer 17, the copper wiring layer 19 is covered with the insulating film 14. The insulating film 14 and the copper wiring layer 19 are flush on the top.

In the present embodiment, the base substrate includes the substrate 11, the release layer 12, and the wiring layer 13. However, the present invention is not limited to this, and the base substrate may be composed of only the substrate 11 or may be composed of only the wiring layer 13 having a sufficient hardness.

The application processor chip 33 is fixed on the wiring layer 13 in the base substrate via an adhesive layer 34. The application processor chip 33 is Face-up mounted so that the circuit-forming surface with a connection part faces away from the base substrate. In this embodiment, one application processor chip 33 is arranged. However, the present invention is not limited thereto, and two or more application processor chips 33 may be arranged.

An insulating photosensitive resin layer 21 is formed on the application processor chip 33. The photosensitive resin layer 21 completely encloses the application processor chip 33 on the base substrate. The application processor chip 33 is embedded in the photosensitive resin layer 21, and the entire upper surface is flattened by the photosensitive resin layer 21. Here, the surface of the application processor chip 33 on which the plurality of connection pads is formed corresponds to the upper surface in the drawing. The thickness of the photosensitive resin layer 21 on the base substrate differs from the thickness of the photosensitive resin layer 21 on the application processor chip 33. The thickness of the photosensitive resin layer 21 (the thickness on the base substrate) is determined by the relation with the lithography process, although the maximum thickness at which the photo via can be formed is the maximum value. It has been demonstrated that the photo via can be formed with the silicone-based photosensitive resin (resin having the Young's modulus of 1 GPA or less at room temperature, 0.1 GPA or less at 120° C., and exposure dose of 800 mJ/cm$^2$ or more and 2600 mJ/cm$^2$ or less) up to a thickness of about 180 μm to 200 μm without any problems in terms of quality. Further, in order to suppress the thickness with reliably covering the application processor chip 33, the thickness of the area overlapping the chip surface having its connection pads of the photosensitive resin layer 21 is preferably 5 μm or 50 μm or less.

The semiconductor device 10 configured as described above may be stored in the semi-finished product in a form of being integrated on the base substrate and may be distributed in some cases. Although not shown in the drawings, when the semiconductor device 10 is distributed, the protective sheet (film) covering the surface of the photosensitive resin layer 21 may be attached for protection and light shielding. Such semiconductor device 10, without forming an embedded pillar by plating or the like to connect a re-distribution layer 42 to be described later and the application processor chip 33, and the re-distribution layer 42 and the existing wiring layer 13 in the base substrate, a via hole 41, a via hole 43 can be formed low-cost and easily with the photo via, and becomes a part of a member for manufacturing a semiconductor device 40 which is a semi-finished product. As will be described later, the semiconductor device 40, which is the semi-finished product in the temporary wafer and the temporary panels, becomes a part of a member for manufacturing a three-dimensional FOWLP 60A and B.

As will be described later, the not shown solder-resist layer patterned on the surface of the insulating film 14 and the copper wiring layer 19 may be formed depending on the manufacturing methods.

<Semi-Finished Product 2>

Figure 2:
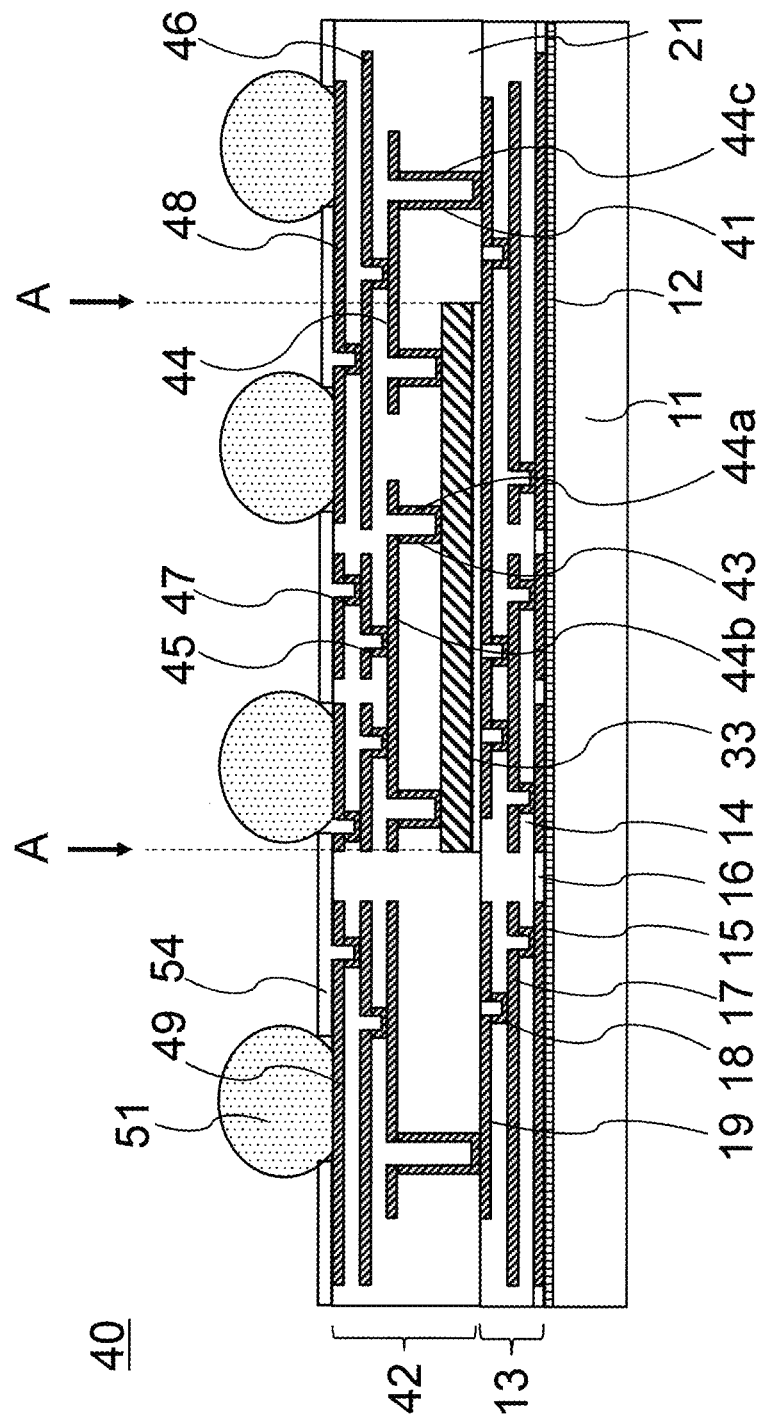
FIG. 2 is a cross-sectional view of a semiconductor device (semi-finished product 2) according to an embodiment of the present invention.

FIG. 2 is a cross-sectional view of the semiconductor device 40 according to an embodiment of the present invention. This semiconductor device 40 is a semi-finished product of a temporary wafer or a temporary panel similar to the semiconductor device 10, and the left and right ends in the drawing are connected to the semiconductor device 40 having the same configuration, and are to be individualized in a later step.

The semiconductor device 40 includes the base substrate with the wiring layer 13, the application processor chip 33 fixed on the base substrate, and a re-distribution layer 42. The semiconductor device 40 is based on the semiconductor device 10 and is formed with the re-distribution layer 42 including the photosensitive resin layer 21.

The re-distribution layer 42 includes the photosensitive resin layer 21 and a copper wiring layer 44. The photosensitive resin layer 21 includes, the via hole 43 exposing the connection part (connection pad) which is a part of the application processor chip 33, and the via hole 41 exposing the connection part of the copper wiring layer 19 of the wiring layer 13 in the base substrate. The copper wiring layer 44 includes a wiring photo via 44a (first wiring photo via) arranged at the inner surface and the bottom surface of the via hole 43, a wiring 44b arranged substantially parallel to the chip surface on which the connection pads of the application processor chip 33 are arranged, and a wiring photo via 44c (second wiring photo via) arranged at the inner surface and the bottom surface of the via hole 41. A part of wiring photo vias 44a and 44c is a power or a ground line, and the wiring photo vias 44a and 44c constituting the power or the ground line are multiplexed so as to cope with a disconnection failure. The wiring 44b is arranged substantially parallelly between the base substrate surface (lower surface) of the photosensitive resin layer 21 and the surface opposite to the base substrate (upper surface) of the photosensitive resin layer 21. In the present embodiment, the wiring photo via 44a arranged at the inner surface and bottom surface of the via hole 43, the wiring 44b, and the wiring photo via 44c arranged at the inner surface and the bottom surface of the via hole 41 is integrated. However, the present invention is not limited to this, the wiring photo via 44a, the wiring 44b, and the wiring photo via 44c may be electrically connected to each other. With such configuration, the application processor chip 33, the wiring layer 13, and the re-distribution layer 42 formed on the application processor chip 33 are three-dimensionally connected through the copper wiring layer 44.

An insulating photosensitive resin constituting the photosensitive resin layer 21 is arranged on the inner surface of the wiring photo via 44a and 44c arranged in the via holes 41 and 43. The inside of the wiring photo via 44a and 44c is filled with the photosensitive resin layer 21. By filling the interior of the wiring photo via 44a and 44c with photosensitive resins, the copper wiring layer can be formed in which the wiring 44b, the wiring photo via 44a and 44c are integrated, without requiring expensive and complicated manufacturing steps to fill the entire wiring photo via 44a and 44c with metallic plating. Therefore, it is possible to suppress an increase in manufacturing cost due to the addition of a special manufacturing process. Thus, the copper wiring layer 44 is embedded in the photosensitive resin layer 21.

The re-distribution layer 42 is three-layer copper wiring layers 44, 46, 48 (metallic wiring layer), but may be further multi-layered or single-layered or double-layered. The copper wiring layer 44 and the wiring photo via 44a and 44c having different depths are integrally formed of copper by the electroplating process and further covered with a photosensitive resin. A patterned copper wiring layer 46 is formed on the copper wiring layer 44 and further covered with a photosensitive material. The copper wiring layer 46 is connected to the copper wiring layer 44 via wiring photo via 45. The patterned copper wiring layer 48 is formed on the upper layer of the copper wiring layer 46. The copper wiring layer 48 is connected to the copper wiring layer 46 via wiring photo via 47. The copper wiring layer 46 and the wiring photo via 45, the copper wiring layer 48 and the wiring photo via 47 are integrally formed of a copper by the electroplating process, respectively. The upper layers of the copper wiring layer 46 and 48 are respectively laminated with the thin film type photosensitive resin, and heat-treated to fill the inside of the wiring photo vias 45 and 47 with the photosensitive resin and flatten the entire surface. Incidentally, the wiring photo vias 44a and 44c having different depths are deeper than the wiring photo via for the simple multilayered wiring of the upper layer. The upper layer of the copper wiring layer 44 is also laminated with the thin film type photosensitive resin, and heat-treated to fill the inside of the wiring photo vias 44a and 44c with the photosensitive resin, and the entire surface is flattened. The copper films of the wiring photo vias 44a and 44c having via diameters of several tens of micrometers may be damaged by the effect of temperature fluctuations due to the manufacturing process and the temperature environment during the operation of the products. The concentration point of the thermal stresses acting on the wiring photo vias 44a and 44c due to the temperature fluctuations is the end of the bottom of the via and the upper end of the via. However, the photosensitive resin (silicone-based or bismaleimide-based resin) used in the present embodiment has a higher coefficient of thermal expansion CTE but a lower Young's modulus (soft) than the other insulating resins (polyimide, epoxy resin, etc.), so that the binding force acting on the copper films of the wiring photo vias 44a and 44c is small, and the shearing force is not generated to the extent that the copper film is damaged. It has been demonstrated that the deeper via length, the higher thermal stresses applied to the edges of via bottoms, but no damage occurs up to about 180 μm to 200 μm. For example, when polyimides or epoxy resins have a low thermal expansion and a high Young's modulus (hard), the binding force exerted on the copper film of the wiring photo via becomes high, and the possibility of damaging the copper film becomes high, so that practical verification is required. It has also been confirmed that the thermal stress caused by the copper wiring per se is higher than that caused by photosensitive resins, and the effect of this thermal stress is particularly large at the upper end of via. However, in the case of the copper wiring in the field of semiconductor packaging, the upper end of the via is not damaged by a via length of about 180 μm to 200 μm.

An insulating layer 54 made of a solder resist or other insulating film is formed on the surface (upper surface) of the photosensitive resin layer 21 opposite to the base substrate. The re-distribution layer 42 is exposed in the area where the insulating layer 54 does not exist. The copper wiring layer 48 of the re-distribution layer 42 exposed from the insulating layer 54 functions as an external connection terminal 49. A plurality of solder balls 51 is arranged on the plurality of external connection terminals 49. That is, the re-distribution layer 42 may be connected to an external substrate or the like through the plurality of solder balls 51 connected to the external connection terminal 49.

The wiring photo vias 44a and 44c are positioned not to overlap with an outer peripheral edge A of the application processor chip 33. The wiring photo vias 45 and 47 are also positioned so as not to overlap with the outer peripheral edge A of the application processor chip 33. Further, it is preferable that the external connection terminal 49 is positioned so as not to overlap with the outer peripheral edge A of the application processor chip 33. The solder ball 51 is also preferably located at a position not to overlap with the outer peripheral edge A of the application processor chip 33. In other words, the photosensitive resin including the application processor chip 33 is completely cured by heat-treating the resin after exposing and developing the soft polymer material of the silicone-based or bismaleimide-based resin, but because the hardness is lower than that of the polyimide resin which is a common re-distribution material and a small step at the part located at the outer peripheral edge A is likely to occur. The reliability of the semiconductor device 40 can be further improved by arranging the external connection terminal 49, the solder ball 51, the wiring photo vias 45 and 47 so as not to overlap with the outer peripheral edge A of the application processor chip 33.

Figure 3:
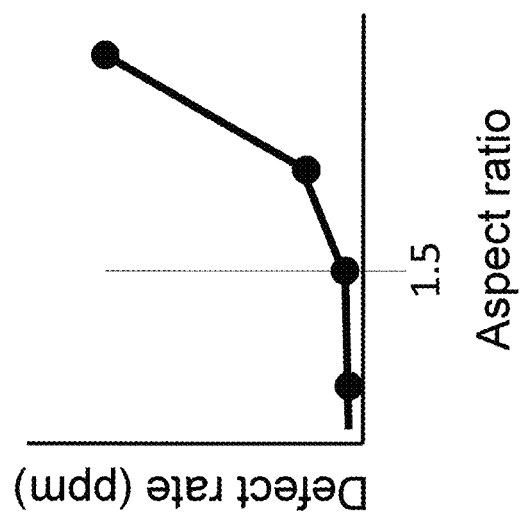
FIG. 3 is a graph showing the reliability of the semiconductor device (semi-finished product 2) according to an embodiment of the present invention.

A plurality of via holes 41 and via holes 43 formed in the photosensitive resin layer 21 are the photo vias formed by selectively irradiating the photosensitive resin with light and dissolving and removing the resin through a development process. The via holes of the wiring photo via 45 and 47 connecting the copper wiring layers 44, 46 and 48 are also photo via. Since the surface on which the connection pads of the application processor chip 33 are formed, and the copper wiring layer 19 of the wiring layer 13 in the base substrate have different heights from the upper surface of the photosensitive-resin layer 21, the depth of the opening of the via hole 43 and the via hole 41 is different. The aspect ratio of the via hole 43 and the via hole 41 is also different. The aspect ratio of the via hole 43 is smaller than the aspect ratio of the via hole 41. Further, the aspect ratio of the via hole 43 is 1.5 or less. As shown in FIG. 3, as the aspect ratio of the via hole is smaller, the defect rate of the wiring photo via formed in the via hole is suppressed. Therefore, since the aspect ratio of the via hole 43 is 1.5 or less, the connection reliability of the wiring photo via 44a arranged on the via hole 43 is improved. Here, the aspect ratio of the via hole 43 and via hole 41 is defined as the aspect ratio obtained by dividing the height of the opening by the largest diameter of the bottom opening end. Since the wiring photo via 44a or the wiring photo via 44c is inscribed with an extremely thin copper film (about 2 μm to 10 μm) in the via hole 43 or the via hole 41, the thickness of the copper film does not affect the aspect ratio of the wiring photo via 44a or the wiring photo via 44c.

The number of the connection pad included in the semiconductor chip mounted on the FOWLP is overwhelmingly larger than the number of the three-dimensional wiring photo via connecting the wiring layer 13 in the base substrate and the re-distribution layer 42. That is, the number of the via hole 43 arranged on the surface on which the connection pads of the application processor chip 33 are formed is larger than the number of via hole 41 arranged on the wiring layer 13 in the base substrate. For example, the number of the via hole 43 arranged on the surface on which the connection pads of the application processor chip 33 are formed is about 200 to 10,000. On the other hand, the via hole 41 arranged on the wiring layer 13 in the base substrate forms a part of the wiring composed of the wiring layer 13 in the base substrate and the re-distribution layer 42, and the number of the via hole 41 is about 20 to 200. Therefore, by setting the aspect ratio of the large number of via holes 43 to 1.5 or less, the connection reliability of the wiring photo via 44a can be improved, and the overall connection reliability can be improved. On the other hand, although it is desirable that the aspect ratio of the small number of via hole 41 is 1.5 or less, if multiple wiring paths are arranged, the entire connection reliability can be maintained, so that the connection can be handled even if the aspect ratio is slightly increased. With such configuration, the reliability of the semiconductor device 40 can be improved and the density of the wiring can be increased. As will be described later, the via hole 43 and the via hole 41 are formed in the same process.

With the above configuration, a part of the connection pads of the application processor chip 33 are electrically connected to the solder ball 51 through the redistribution layer 42, and another part of the connection pads are electrically three-dimensionally connected to the copper wiring layers in the wiring layer 13 in the base substrate through the copper wiring layer 44 passing through the via hole 41.

The semiconductor device 40 configured as described above is also stored in the form of the semi-finished product in the form of being integrated in the substrate 11 and may be distributed in some cases. Such a semiconductor device 40 becomes a part of the member for manufacturing the three-dimensional FOWLP 60A and 60B.

<Mounting of the Semiconductor Device According to an Embodiment of the Present Invention>

Figure 4:
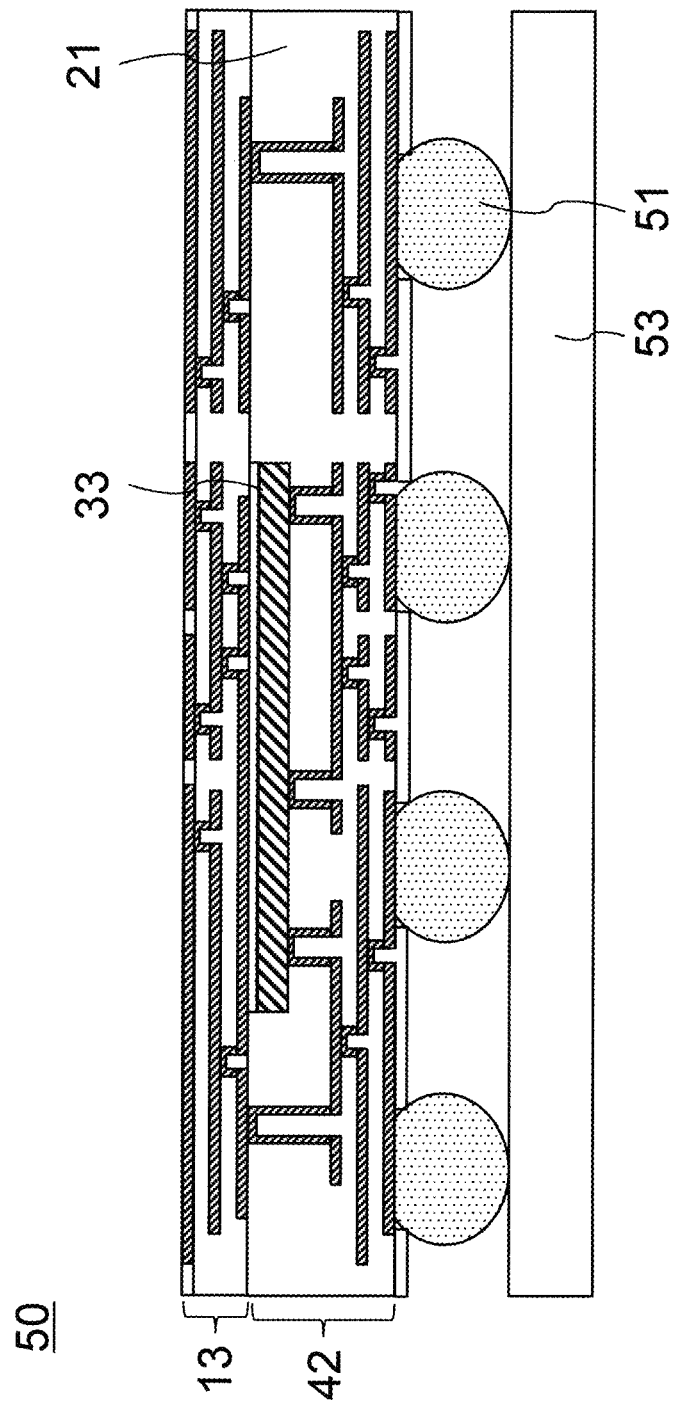
FIG. 4 is a cross-sectional view of a semiconductor device (after mounting) according to an embodiment of the present invention.

FIG. 4 is a cross-sectional view showing a state in which the semiconductor device according to an embodiment of the present invention is mounted on a print substrate 53 (semiconductor device 50). In this step, the substrate 11 of the semiconductor device 40 is peeled off together with the peeling layers by laser irradiation or mechanical separation. This peeling may be performed as it is in the shape of the wafer before individualization or after individualization. At this stage, the semiconductor chip has not yet been three-dimensionally mounted. The mounting method up to this stage will be described below.

The semi-finished product 2 shown in FIG. 2 is individualized using the dicing saw or the like. It should be noted that the semiconductor device according to one embodiment of the present invention may be stored and distributed in an individualized form. Mounting to the print substrate 53, first, the individualized semiconductor device 40 is inverted upside down, and mounted on the print substrate 53. The solder ball 51 is mounted for landing on the connection terminal of the print substrate 53. Subsequently, hot air is blown (reflow process), whereby the solder ball 51 is melted and electrically connected to the connection terminal of the print substrate 53.

<Three-Dimensional Mounting of the Semiconductor Device According to an Embodiment of the Invention>

Figure 5:
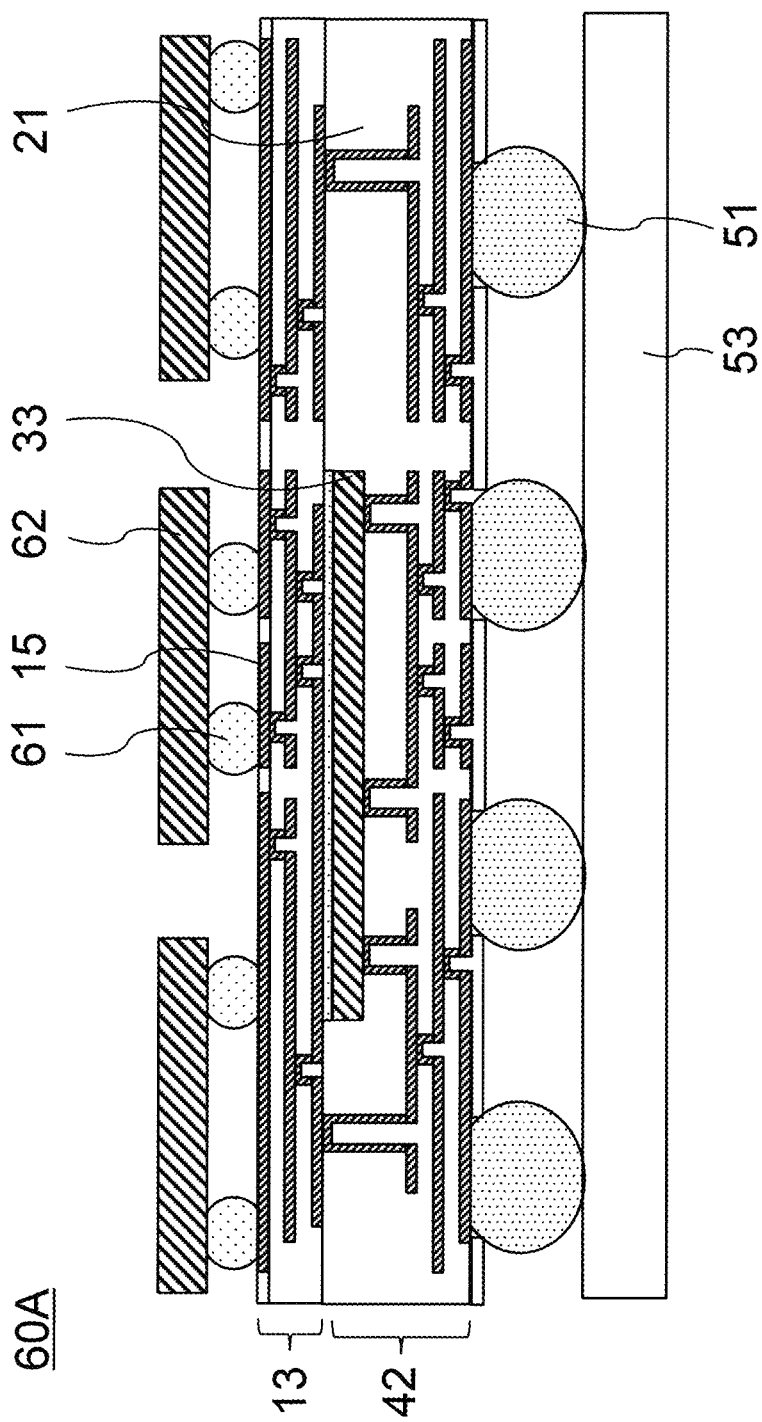
FIG. 5 is a cross-sectional view of a semiconductor device (after mounting) according to an embodiment of the present invention.

FIG. 5 is a cross-sectional view showing a state of a three-dimensional semiconductor device (post-mounting) according to an embodiment of the present invention (three-dimensional semiconductor device 60A). The mounting method up to this stage will be described below.

In the condition shown in FIG. 5, the solder balls 51 are covered with an underfill which is not shown in the figure. The underfill is a highly flowable epoxy resin, and when the epoxy resin is dropped in the vicinity of the individualized semiconductor device, the epoxy resin flows between the print substrate 53 and the re-distribution layer 42 by capillarity. In this way, the solder ball 51 is covered with the underfill.

Subsequently, a memory 62 such as a DRAM or a flash memory serving as an external memory of the application processor chip 33 is prepared. These memories 62 are packages of the ball grid array (BGA) type, and there are a large number of solder balls 61 for the external connection. The memory 62 is mounted so that a solder ball 61 lands on the connection pad 15 of the wiring part of the semiconductor device 50 (from which the substrate 11 has already been peeled off and the wiring layer 13 has been exposed). Subsequently, hot air is blown (reflow process), whereby the solder ball 61 is melted and electrically connected to the connection pad 15. The underfill described above can prevent the solder ball 51 from being damaged in the reflow process.

<Second Three-Dimensional Mounting of the Semiconductor Device According to an Embodiment of the Invention>

In FIG. 5, prior to mounting on the print substrate 53, the memory 62 can be mounted on the connection pad 15. After making the three-dimensional product, it can be mounted on the print substrate 53 as the three-dimensional FOWLP. The memory 62 is electrically connected to the connection pad 15 through the solder ball 61. The solder ball 61 may be covered with a not shown underfill between the memory 62 and the wiring layer 13. The semiconductor device 60A prior to mounting on the print substrate 53 will be tested and distributed as the three-dimensional FOWLP product.

As a result, the three-dimensionally mounted application processor chip 33 and the memory 62 are electrically connected to each other, and the memory is connected to the print substrate by system integration.

As described above, the semiconductor device according to an embodiment of the present invention enables the three-dimensional mounting suitable for system integration in the FOWLP structure and enables low-cost and easy designing without hindering high-speed operation.

<Third Three-Dimensional Mounting of the Semiconductor Device According to an Embodiment of the Invention>

Figure 6:
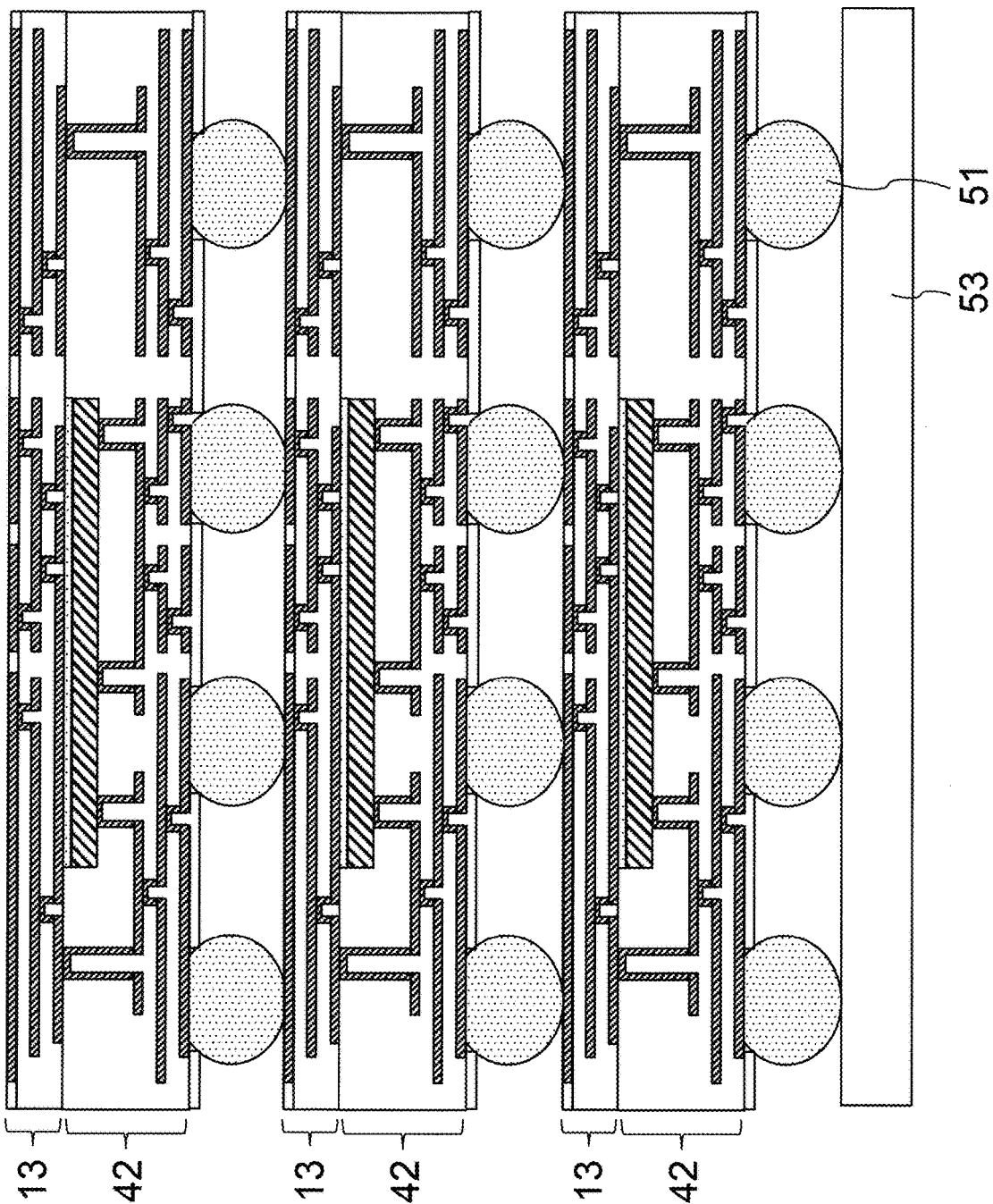
FIG. 6 is a cross-sectional view of a semiconductor device (after mounting) according to an embodiment of the present invention.

In the embodiment of the present invention, a configuration in which the semiconductor element is stacked in two layers is shown in FIG. 5 as an example of the three-dimensional mounting, but the present invention is not limited to this, and for example, as shown in FIG. 6, the semiconductor device shown in FIG. 2 may be stacked in three or more layers. This makes it possible to carry out mounting at a higher density. In the semiconductor device shown in FIG. 2, one application processor chip 33 is arranged. However, the present invention is not limited to this, and various types of system integration are possible. As will be described later, two or more application processor chips 33 may be arranged, and each application processor chip 33 may have the same height or different heights. The plurality of application processor chips 33 may be arranged on an overlapping manner. The present invention is not limited to the application processor chip 33, and may be a memory chip, a controller chip for data storage or graphic processing, or a system integration using combinations of analogue, RF chips, electronic components, or the like.

<Method of Manufacturing Semi-Finished Product 1>

Figure 7:
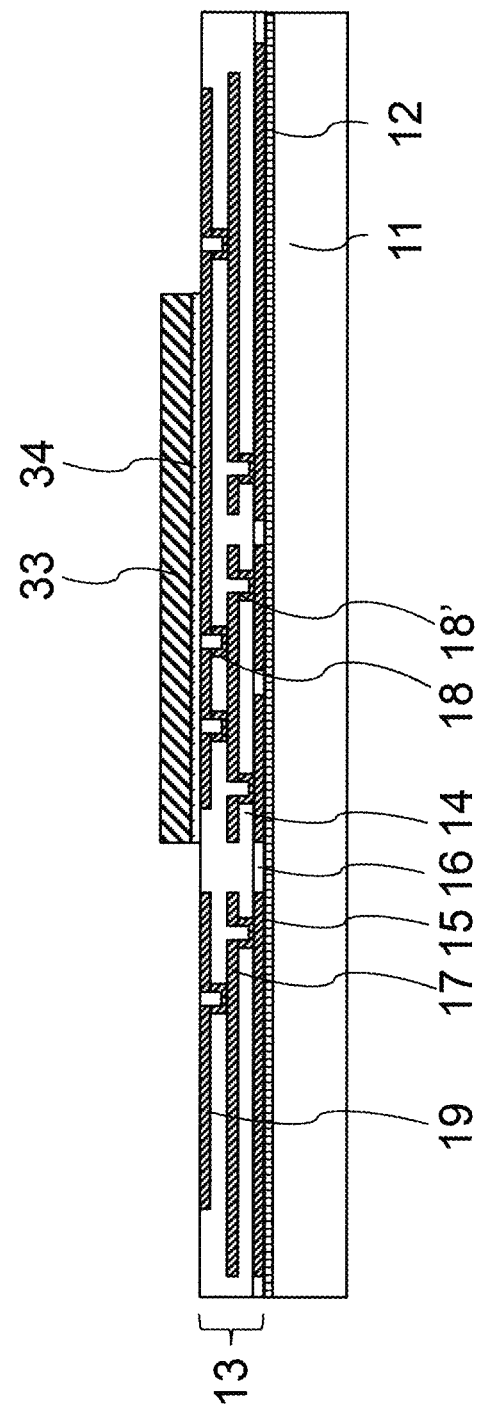
FIG. 7 is a cross-sectional view showing a method of manufacturing semiconductor device (semi-finished product 1) according to an embodiment of the present invention.
Figure 8:
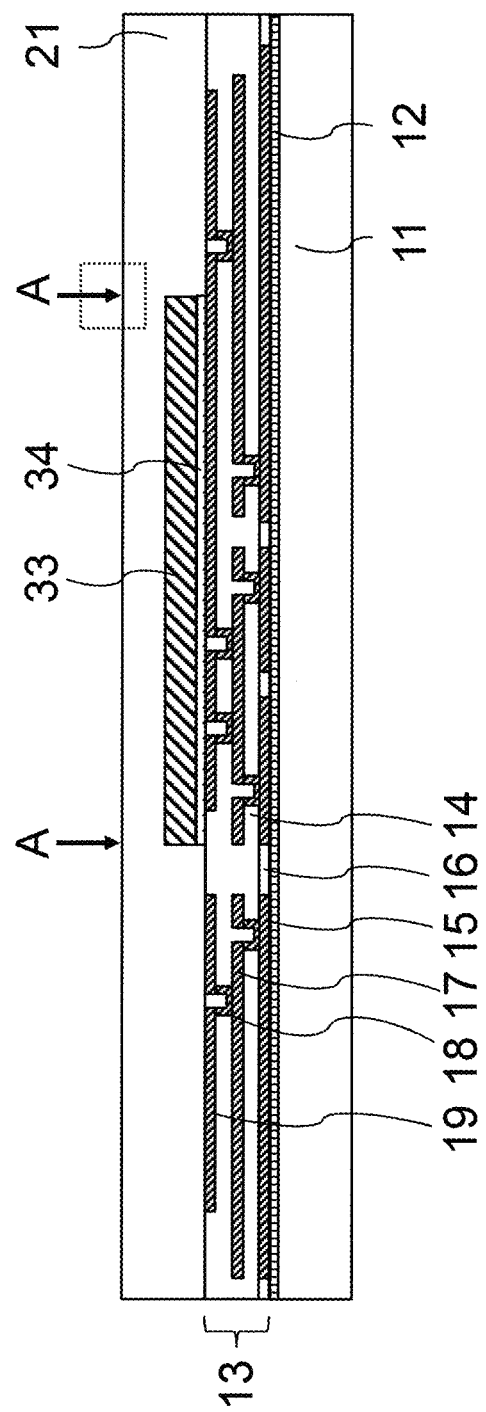
FIG. 8 is a cross-sectional view showing a method of manufacturing semiconductor device (semi-finished product 1) according to an embodiment of the present invention.

FIGS. 7 and 8 show a manufacturing process of the semiconductor device 10, which is the semi-finished product on a temporary wafer or a temporary panel.

FIGS. 7 and 8 are a cross-sectional view showing a method of manufacturing semiconductor device (the semi-finished product 1 on the temporary wafer or the temporary panel) according to an embodiment of the present invention. As shown in FIG. 7, at first, the substrate 11 having a rigidity is prepared. For the substrate 11 of the semiconductor device, the translucent substrate 11 such as glasses or plastics is used when it is peeled off by laser radiation or the like in a later step. In addition to the transparent glass and plastic, silicon, ceramics, metals, or non-transparent plastics might be used for those that do not need to have laser irradiation. The release layer 12 is formed on the substrate 11. The material of the release layer 12 includes the adhesive layer and the pure release layer. The adhesive layer is composed of the polyethylene terephthalate layer having a thickness of about 10 micrometers. Preferably, the pure release layer is comprised of a polymeric compound layer comprising the hydroxyl groups and the light absorbing groups having a thickness of 1 μm or less, typically about 0.3 μm, and the total thickness is in the range of several μm to several tens of μm, typically about 10 μm. In the case of mechanical peeling, the light absorbing group is unnecessary for the release layer.

The wiring layer 13 is formed on the release layer 12 in contact with the release layer 12. The wiring layer includes the copper wiring and is formed by etching or copper plating methods. The pattern of the insulating layer 16 is complementary to the pattern of the copper wiring layer 15. That is, the part where the insulating layer 16 does not exist is the copper wiring layer 15 and functions as the connection pad 15. The patterned copper wiring layer 17 is formed on the connection pad 15 and the insulating layer 16. The copper wiring layer 17 is connected to the copper wiring layer 15 through the via 18'. The via 18' is made of the copper wiring integrally with the copper wiring layer 17. Subsequently, the copper wiring layer 17 is covered with the insulating film 14. An opening is formed on the insulating film 14. Generally, the opening is formed by photolithography or laser radiation. A metal layer formed in the opening formed by the former is called a photo via, and a metal layer formed in the opening formed by the latter is called a laser via. The material used for the insulating film 14 is a photosensitive insulating material when the photo via is formed, or a non-photosensitive insulating material when the laser via is formed.

The copper wiring layers 15, 17, and 19 are formed by etching or the copper-plating methods. The process for forming the copper wiring layers 15, 17, and 19 by the copper-plating process is as follows. First, a titanium (Ti)/copper (Cu) thin film stacked layer serving as a copper plating seed is formed on the entire surface by sputtering. A photosensitive resist is applied thereon and patterned to expose a wiring region. Subsequently, copper (Cu) plating is performed using the titanium (Ti)/copper (Cu) thin film stacked layer exposed by the photosensitive resist as a seed. The photosensitive resist is then stripped to etch away seed layer other than the copper wiring pattern to form the copper wiring layers 15, 17, and 19. The wiring by the etching is omitted here. If the wiring layer 13 has enough hardness so as not to cause a problem in the manufacturing process, the substrate 11 or the release layer 12 may not be required.

On the wiring layer 13, the application processor chip 33 is fixed at a distance (FIG. 7). The thickness of the application processor chip 33 is usually 100 μm or less and is generally about 70 μm in many cases. The surface on which the integrated circuit is formed (the surface on which the connection pads are formed) of the application processor chip 33 corresponds to the upper surface in the figure.

The photosensitive resin layer 21 made of the photosensitive resin is formed on the application processor chip 33. The thickness of the photosensitive resin layer 21 is less than 200 μm and is 10 μm to 50 μm thicker than the thickness of the application processor chip 33. If the thickness of the application processor chip 33 is 70 μm, the photosensitive resin layer 21 is about 100 μm. The material of the photosensitive resin is not particularly limited but is formed by vacuum lamination of a dry film. First, the film type photosensitive resin is laminated on the application processor chip 33 (evacuating after the film type photosensitive resin is temporarily bonded onto the application processor chip 33 at 100° C.), and the raised portion on the application processor chip 33 is flattened by a simple press (flattened at 60° C. for about 5 minutes) and pre cured (at 100° C. for about 5 minutes). The insulating photosensitive resin is composed of a silicone-based or bismaleimide-based resin or a soft polymer material. Since the photosensitive resin is embedded so as to cover the application processor chip 33, it is desirable that the elastic modulus (Young's Modulus) of the photosensitive resin is equal to or less than 1 GPA at room temperature and equal to or less than 0.1 GPA at 125° C. When the photosensitive resin layer 21 is a silicone-based resin, the elastic modulus of the silicone-based resin can be set within the above ranges by appropriately adjusting the cross-link densities and the lengths of the molecular chains. Since the general epoxy encapsulant is a few dozen GPAs at normal temperature, materials with a considerably low elasticity coefficient will be used. As the photosensitive resin layer 21, known photosensitive resin materials can be used as long as the above condition is satisfied. If the elastic modulus becomes equal to or higher than 1 GPA at room temperature or equal to or higher than 0.1 GPA at 125° C., the application processor chip 33 becomes difficult to be embedded, and thus, disturbances such as voids, delamination, and chip damage at the time of embedding tend to occur.

The photosensitive resin layer 21 is formed by vacuum lamination using the dry film, whereby the upper surface (the surface opposite to the substrate 11) can be formed substantially flat. However, the upper surface of the photosensitive resin layer 21 (the surface opposed to the substrate 11) may be slightly raised at the position where the application processor chip 33 is arranged, and the upper surface of the photosensitive resin layer 21 may have a small step along the outer peripheral edge (arrow A in FIG. 8) of the application processor chip 33. In the planarization process, even if this small step is generated, it is controlled to be several microns or less (the wiring widths or less).

Figure 9:
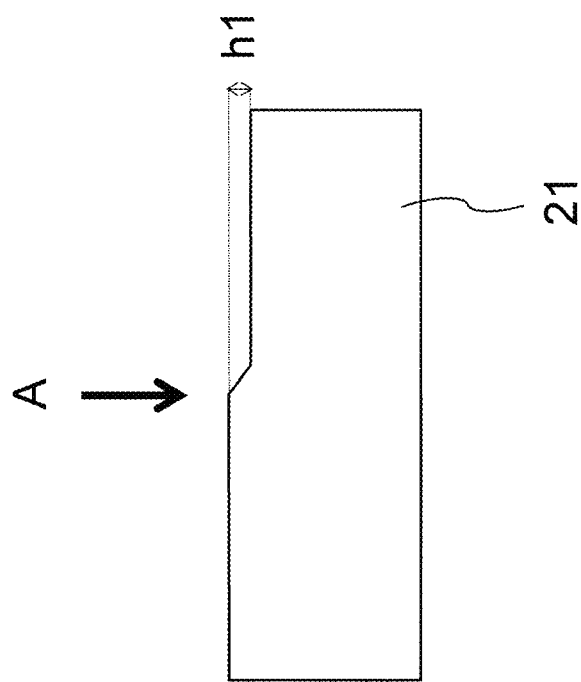
FIG. 9 is a cross-sectional view showing a method of manufacturing semiconductor device (semi-finished product 1) according to an embodiment of the present invention.

FIG. 9 is an enlarged cross-sectional view (dotted line region in FIG. 8) showing the photosensitive resin layer 21 in which the small step is generated. As shown in FIG. 9, the photosensitive resin layer 21 has a small step in the region overlapping with the outer peripheral edge A of the application processor chip 33. The re-distribution formed upward so as to straddle the step is affected by the height h1 of the step, and the possibility of disconnection increases if the wiring width is narrowed. In order to suppress the possibility of disconnection, in terms of reliability, it is preferable that the wiring width to be wide and the step h1 to be controlled to be low.

<Method of Manufacturing Semi-Finished Product 2>

FIGS. 10 to 17 show a manufacturing process of the semiconductor device 40 which is the semi-finished product in the temporary wafer or the temporary panels.

FIGS. 10 to 17 are a cross-sectional view showing a method of manufacturing semiconductor device (the semi-finished product 2 on the temporary wafer or the temporary panel) according to an embodiment of the present invention.

Figure 10:
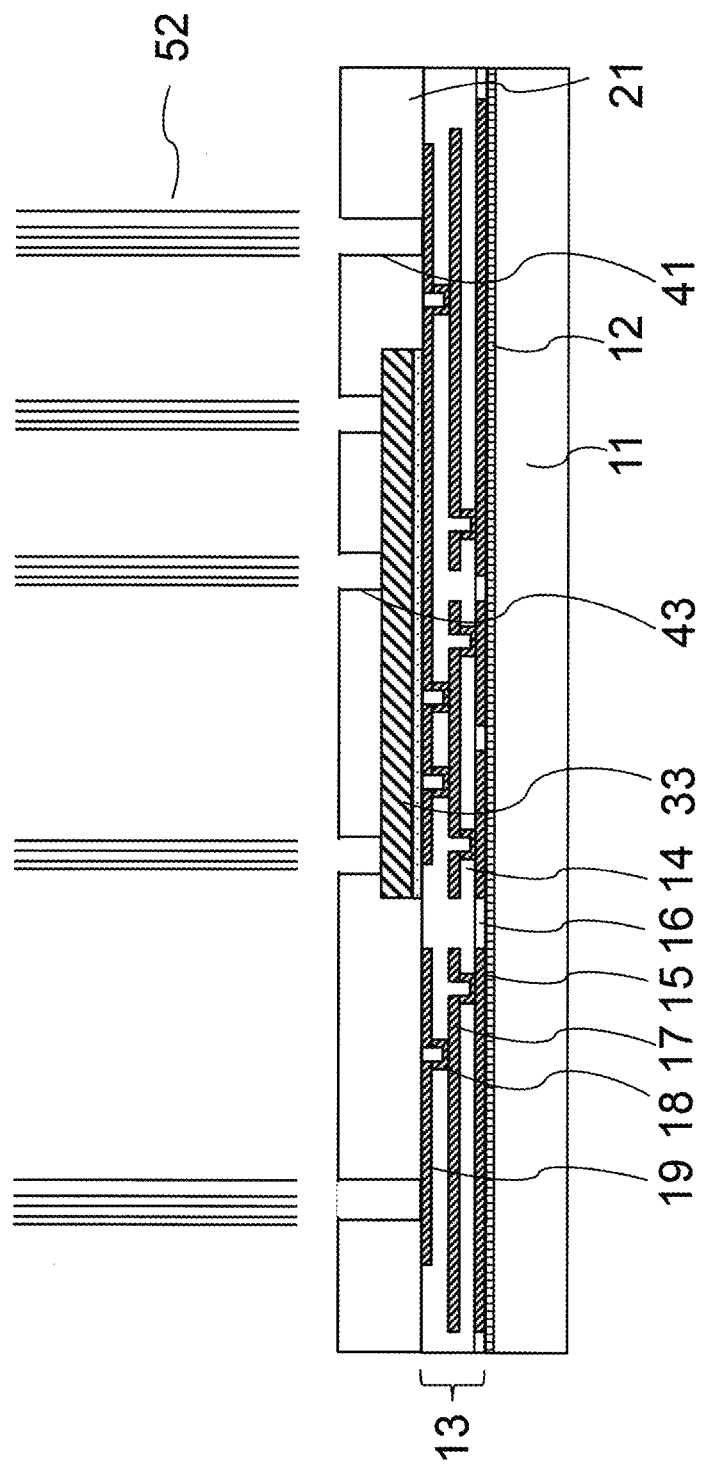
FIG. 10 is a cross-sectional view showing a method of manufacturing semiconductor device (semi-finished product 2) according to an embodiment of the present invention.

First, the flattened photosensitive resin layer 21 is temporarily heated to such an extent that it is not completely cured (pre-cured), and thereafter, as shown in FIG. 10, UV light 52 is selectively irradiated and exposed toward the photosensitive resin layer 21 from the photosensitive resin layer 21 side of the semiconductor device 10 fixed on the wiring layer 13 in the base substrate, and further thermal processing is performed. The photosensitive resin selectively irradiated is dissolved and removed by the development process (developed). Thereafter, main curing is performed by heat treatment to form the via holes 41 and 43 of the photosensitive resin layer 21. The completely cured photosensitive resin layer 21 has a Young's modulus, which is lower than that of mold resin of the semiconductor chip such as epoxy resin material by one order of magnitude, but the shapes of the formed via holes 41 and 43 are not changed unless an impact is applied thereto. At this time, the via hole 43 is formed on the connection pad of the application processor chip 33, and the opening of the via hole 41 is formed on the connection part of the wiring layer 13 substantially simultaneously. The UV light 52 is generated by a metal halide lamp or a high-pressure mercury lamp, and it is desirable to selectively scanning (Scanning) and irradiate the surface of the photosensitive resin layer 21 through a movable mirror. If the substrate 11 is large and it takes too long time to selectively illuminate by scanning, a stencil mask may be used to selectively illuminate the UV light.

It is desirable that the photosensitive resin is exposed at an exposure amount of 800 mJ/cm$^2$ or more and 2600 mJ/cm$^2$ or less. In other words, a photo crosslinking material or the like of the photosensitive resin is appropriately selected so that the via hole 41 and the via hole 43 can be formed by the exposure amount within the above range. The photosensitive resin desirably has a light transmittance of 500 nm of 99.7%, a light transmittance of 450 nm of 99.1%, a light transmittance of 400 nm of 97.6%, a light transmittance of 350 nm of 86.4%, and a light transmittance of 300 nm of 0%. More preferably, the photosensitive resin has a light transmittance of 85% or more at a wavelength of 350 nm or more. Here, the light transmittance of the photosensitive resin was calculated by forming and curing a 15 μm-thick resin film on a glass substrate and calculating the transmittance from the light absorption/transmittance at the respective wavelengths. When the photosensitive resin is a silicone-based resin, the light transmittance can be set within the above range by appropriately adjusting the crosslink density, the length of the molecular chain, and the like. By setting the exposure amount and the light transmittance of the photosensitive resin of the photosensitive resin layer 21 within the above ranges, the via hole 41 and the via hole 43 can be formed.

The surface on which the connection pads are formed of the wiring layer 13 in the base substrate and the application processor chip 33 differ in height from the upper surface of the photosensitive resin layer 21. Therefore, the aspect ratios of the via hole 43 and the via hole 41 are also different. The aspect ratio of the via hole 43 is smaller than the aspect ratio of the via hole 41. Further, it is preferable that the aspect ratio is 1.5 or less. When the application processor chip 33 has a thickness of about 70 μm, the photosensitive resin layer 21 has a thickness of about 100 μm, the diameter of the via hole 43 is 30 μm, and the diameter of the via hole 41 is 70 μm, the aspect ratio of the via hole 43 is 1.0, and the aspect ratio of the via hole 41 is 1.42.

Figure 11:
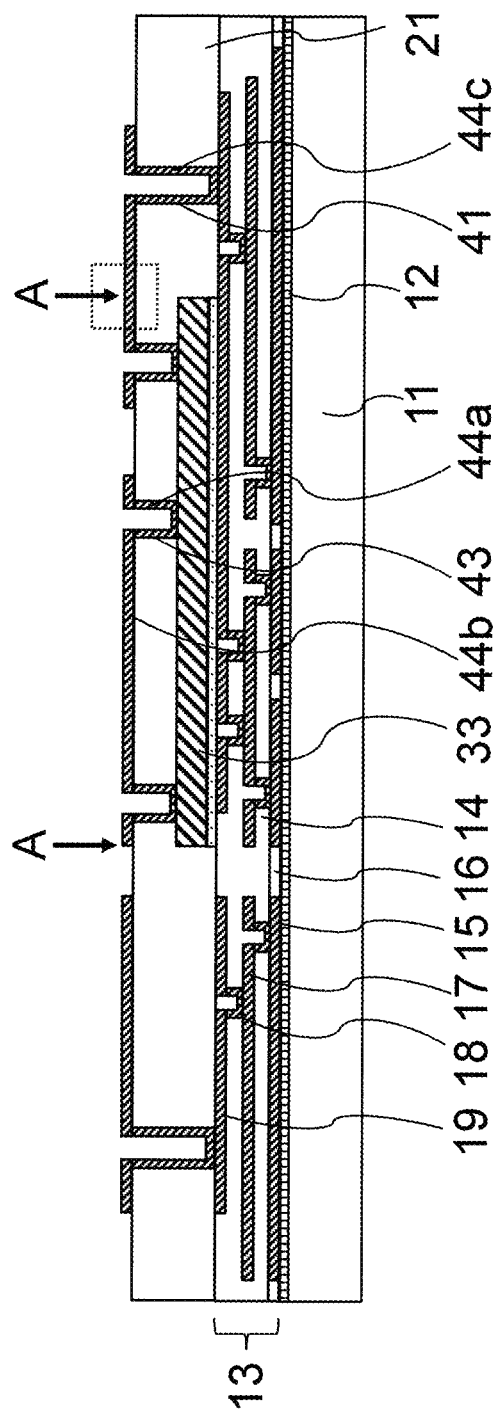
FIG. 11 is a cross-sectional view showing a method of manufacturing semiconductor device (semi-finished product 2) according to an embodiment of the present invention.

As shown in FIG. 11, the copper wiring layer 44 is formed by a copper-plating process, and the manufacturing process thereof is as follows. First, the titanium (Ti)/copper (Cu) thin film stacked layer serving as a copper plating seed is formed on the entire surface by sputtering. The photosensitive resist is applied over the surface and patterned to expose the wiring region. Subsequently, after copper (Cu) plating is performed using a part of the titanium (Ti)/copper (Cu) thin film stacked layer exposed by the photosensitive resist as a seed, the photosensitive resist is peeled off and the seed layer other than the copper wiring pattern is etched away, thereby forming the copper wiring layer 44. Through this process, the inner surface of the via holes 41 and 43 is also copper plated to form the wiring photo vias 44c and 44a. That is, the wiring 44b and the wiring photo vias 44c and 44a arranged on the upper surface of the photosensitive resin layer 21 are integrally formed.

Figure 12:
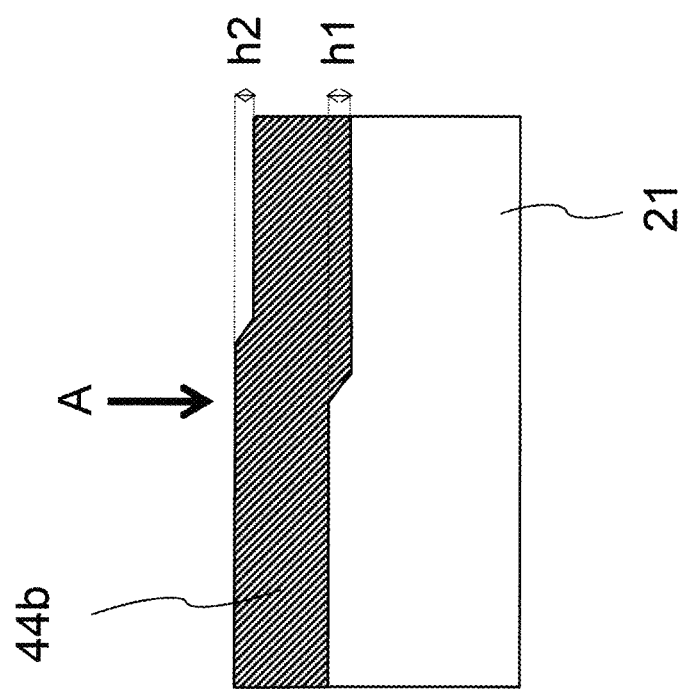
FIG. 12 is a cross-sectional view showing a method of manufacturing semiconductor device (semi-finished product 2) according to an embodiment of the present invention.
Figure 13:
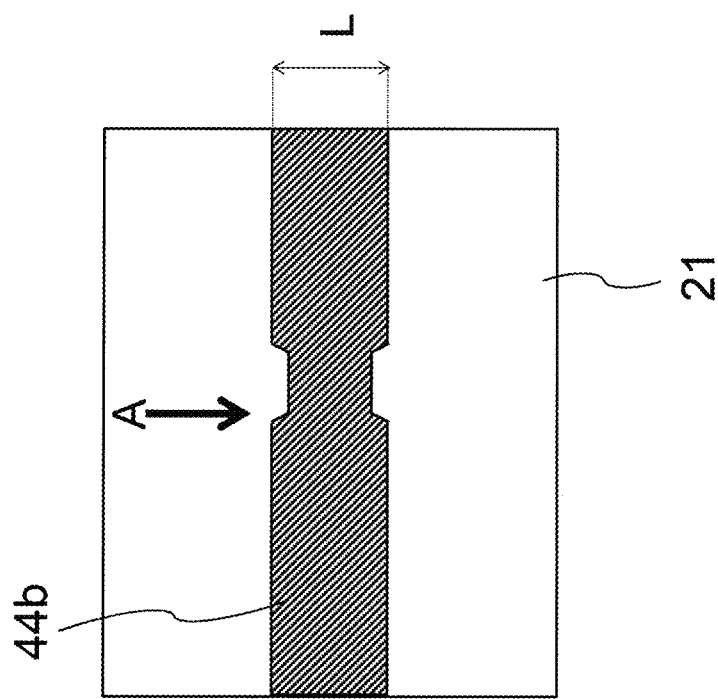
FIG. 13 is a top view showing a method of manufacturing semiconductor device (semi-finished product 2) according to an embodiment of the present invention.

The upper surface of the photosensitive resin layer 21 may be stepped along the outer peripheral edge of the application processor chip 33 (arrow A in FIG. 11). Therefore, the wiring 44b formed on the upper surface of the photosensitive resin layer 21 may also have a step when straddling the outer peripheral edge (arrow A in FIG. 11) of the application processor chip 33. FIGS. 12 and 13 are the cross-sectional view and the top view of the enlargement of region (dashed line region in FIG. 11) overlapping with the outer peripheral edge A of the application processor chip 33 of the top surface of the photosensitive resin layer 21 and the wiring 44b. As shown in FIG. 12, the wiring 44b has a step in the region overlapping the outer peripheral edge A of the application processor chip 33, but the height h2 of the step of the wiring 44b is slightly smaller than the height h1 of the step of the photosensitive resin layer 21 by patterning the copper wiring.

As shown in FIG. 13, when the wiring 44b formed on the upper surface of the photosensitive resin layer 21 is formed with a small step on the upper surface of the photosensitive resin layer 21, the positive photosensitive resist is excessively exposed by the light reflected by the step, and the width of the wiring 44b in the vicinity of the boundary of the step may be slightly narrowed. In the present embodiment, since the level difference on the upper surface of the photosensitive resin layer 21 is flattened to be equal to or less than the designed wiring width, even if the wiring width is narrowed, the wiring 44b is prevented from being disconnected.

On the other hand, since the small step on the upper surface of the photosensitive resin layer 21 is flattened with respect to the soft photosensitive resin layer 21, it is not a steep step but a gentle slope. This slope buffers the stresses on the wiring 44b.

Figure 14:
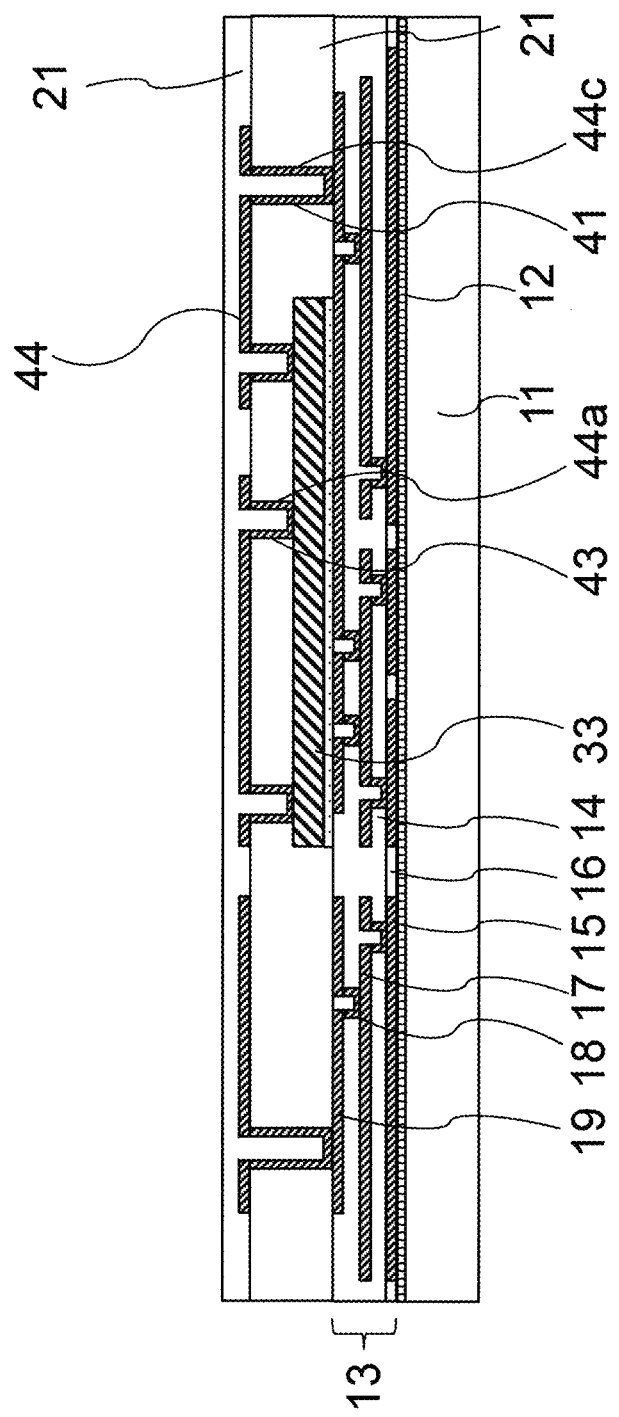
FIG. 14 is a cross-sectional view showing a method of manufacturing semiconductor device (semi-finished product 2) according to an embodiment of the present invention.

As shown in FIG. 14, the photosensitive resin layer 21 made of the photosensitive resin is formed on the copper wiring layer 44. Specifically, it is formed by vacuum lamination using the film type photosensitive resin material (dry film) having a film thickness of about 15 μm. As a result, the inside of the wiring photo vias 44a and 44c is filled with the photosensitive resin, and the exposed upper surface of the photosensitive resin becomes flat. For the photosensitive resin arranged on the copper wiring layer 44, the same material system as the photosensitive resin for embedding the application processor chip 33 is used. Since the film thickness is about 5 μm, it is also possible to spin coat or slit coat a photosensitive resin material in a liquid state.

Figure 15:
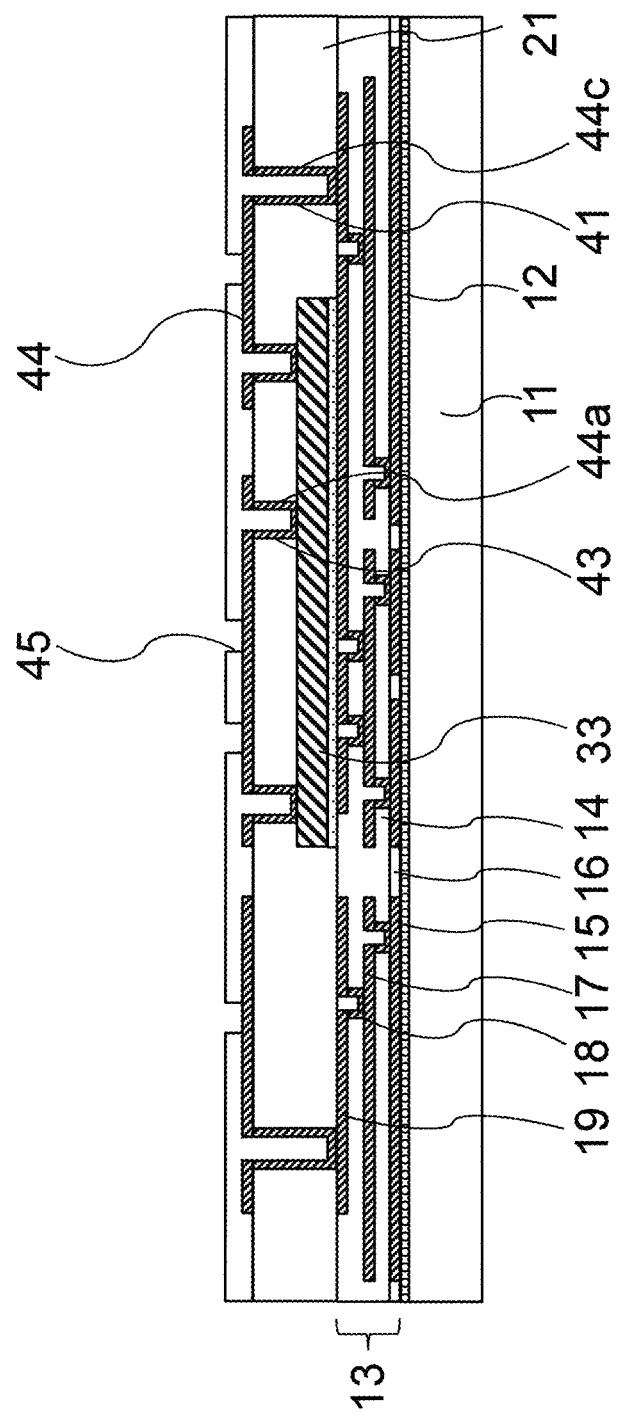
FIG. 15 is a cross-sectional view showing a method of manufacturing semiconductor device (semi-finished product 2) according to an embodiment of the present invention.
Figure 16:
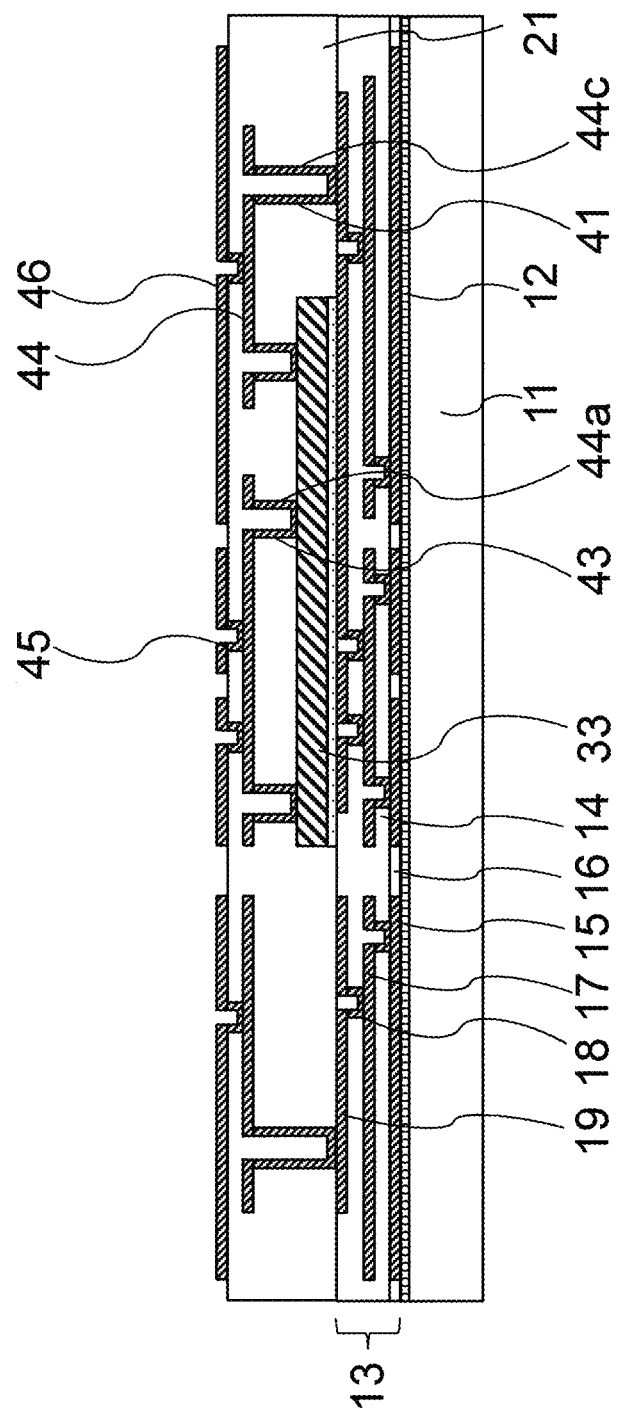
FIG. 16 is a cross-sectional view showing a method of manufacturing semiconductor device (semi-finished product 2) according to an embodiment of the present invention.

As shown in FIG. 15, the via hole for the wiring photo via 45 is formed in the photosensitive resin layer 21 on the copper wiring layer 44 through the process of pre curing, exposure, development, and main curing. The wiring photo via 45 is formed by a subsequent copper-metallization process. As shown in FIG. 16, the copper wiring layer 46 is also formed by repeating the same process as the copper wiring layer 44.

Figure 17:
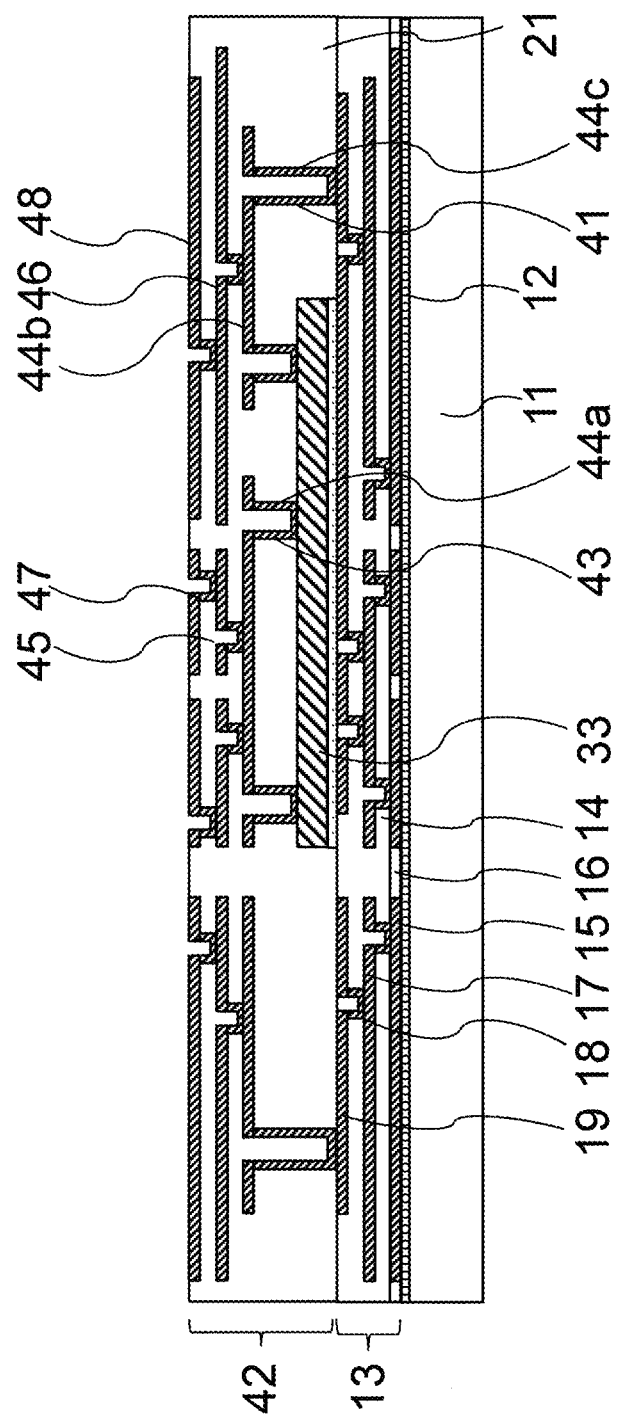
FIG. 17 is a cross-sectional view showing a method of manufacturing semiconductor device (semi-finished product 2) according to an embodiment of the present invention.

As shown in FIG. 17, the photosensitive resin layer 21 made of the photosensitive resin is further formed on the copper wiring layer 46. Specifically, it is formed by vacuum lamination using the film type photosensitive resin material (dry film) having a film thickness of about 5 µm to 10 µm. As a result, the inside of the wiring photo via 45 is filled with the photosensitive resin, and the exposed upper surface of the photosensitive resin becomes flat. It is preferable to use the same material system for the photosensitive resin arranged on the copper wiring layer 46 as the photosensitive resin that embeds the application processor chip 33. Since the film thickness is about 5 µm to 10 µm, it is also possible to spin coat or slit coat the photosensitive resin material in a liquid state. The wiring photo via 47 and the copper wiring layer 48 of the re-distribution layer 42 are also formed by repeating the same process. By using the same photosensitive resin, each layer is multilayered by bonding without a boundary layer, and the photosensitive resin layer 21 is integrated. Note that even in the case of a different type of liquid photosensitive resin system, since each layer is thin, the bonding is somewhat weakened, but the interlayer bonding capable of securing a predetermined quality is possible.

In this manner, the application processor chip 33 and the wiring layer 13 in the base substrate having different heights can be connected to the re-distribution layer 42 at low costs by using the wiring photo via without using complicated techniques such as penetration pillars, penetration electrodes, laser vias, and the like.

<Semi-Finished Product 3>

Figure 18:
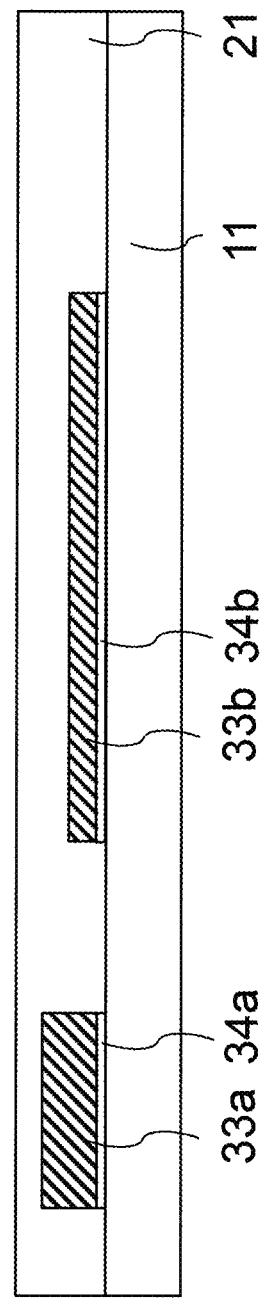
FIG. 18 is a cross-sectional view of a semiconductor device (semi-finished product 3) according to an embodiment of the present invention.

FIG. 18 is a cross-sectional view of a semiconductor device 10A according to an embodiment of the present invention. The semiconductor device 10A is a semi-finished product of the temporary wafer or the temporary panels, and the left and right ends in the drawing are connected to the semiconductor device 10A having the same configuration and is to be individualized in a later process. The semiconductor device 10A according to the present embodiment differs from the semiconductor device 10 according to the semi-finished product 1 in that it does not include the wiring layer 13 in the base substrate and includes the plurality of application processor chips 33. In the figures referred to in the following embodiment, a part identical to those of the semi-finished product 1 or a part having similar functions are denoted by the same numerals or numerals followed by alphabetical characters, and repeated descriptions thereof are omitted.

The semiconductor device 10A includes the base substrate, the photosensitive resin layer 21 formed on the base substrate, an application processor chip 33a (semiconductor element, first electronic circuit element) and an application processor chip 33b (semiconductor element, second electronic circuit element) arranged in the photosensitive resin layer 21. Although not shown in the figures, when the semiconductor device 10 is distributed, the protective sheet (film) covering the surface of the photosensitive resin layer 21 may be attached for element protection and light shielding.

The application processor chip 33a and the application processor chip 33b having different chip thicknesses are fixed on the base substrate via an adhesive member 34a or an adhesive member 34b. The application processor chip 33a and the application processor chip 33b are mounted spaced apart by Face-up so that the surface on which the connection parts are formed faces the side opposite to the base substrate. In this embodiment, two application processor chips 33 are juxtaposed. However, the present invention is not limited to this, and one application processor chip 33 may be arranged, or three or more application processor chip 33 may be arranged side by side. The thickness of the application processor chip 33a is larger than the thickness of the application processor chip 33b. The application processor chip 33a and the application processor chip 33b are embedded in the photosensitive resin layer 21 and flattened with respect to the base substrate by the simple press of the photosensitive resin layer 21. Here, the surface on which the connection pads of the application processor chip 33a and the application processor chip 33b are formed corresponds to the upper surface in the drawing. For this reason, the surface on which the connection pads of the application processor chip 33a and the application processor chip 33b are formed is embedded in the photosensitive resin layer 21, and the distance from the upper surface of the photosensitive resin layer 21 is different. The thickness of the photosensitive resin layer 21 is determined by the relation with the lithography process, although the maximum thickness at which the photo via can be formed is the maximum value. It has been demonstrated that the photo via can be formed in the silicone-based photosensitive resin up to about a thickness of 180 µm to 200 µm without any problem in quality. In order to suppress the thickness with reliably covering the thickest application processor chip 33a, the thickness of the region overlapping with the surface of the connection pad is preferably 5 µm or 50 µm or less.

Such semiconductor device 10A can be formed at low cost and easily by the photo via without forming a long buried pillar by plating or the like in the via hole 43 for connecting the re-distribution layer 42 which will be described later and the plurality of application processor chips 33, and becomes a part of a member for manufacturing a semiconductor device 40A which is a semi-finished product.

<Semi-Finished Product 4>

Figure 19:
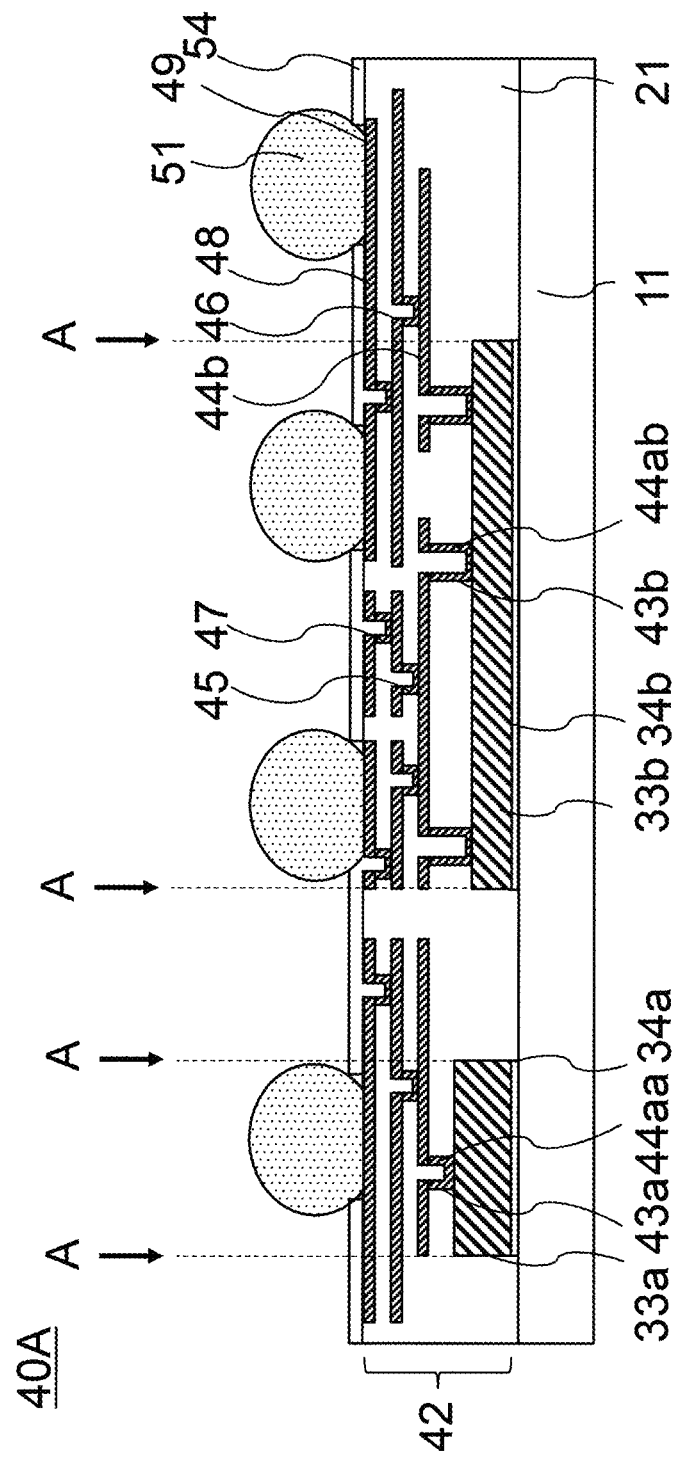
FIG. 19 is a cross-sectional view of a semiconductor device (semi-finished product 4) according to an embodiment of the present invention.

FIG. 19 is a cross-sectional view of the semiconductor device 40A according to an embodiment of the present invention. The semiconductor device 40A is a semi-finished product on the temporary wafer or the temporary panels as in the semiconductor device 10A, and the left and right ends in the figure are connected to the semiconductor device 40A having the same configuration, and are to be individualized in a later process.

The semiconductor device 40A includes the base substrate, the application processor chip 33a and the application processor chip 33b fixed on the base substrate, and the re-distribution layer 42. The semiconductor device 40A is based on the semiconductor device 10A, and the re-distribution layer 42 is formed on the photosensitive resin layer 21.

The re-distribution layer 42 includes the photosensitive resin layer 21 and the copper wiring layer 44. The photosensitive resin layer 21 includes a plurality of via holes 43a and 43b that expose the connection part (connection pad) that is part of the application processor chips 33a and 33b. The copper wiring layers 44 include the wiring photo via 44aa (first wiring photo via) and wiring photo via 44ab (third wiring photo via) arranged on the inner surface and the bottom surface of the via holes 43a and 43b, and the wiring 44b arranged substantially parallel to the surfaces on which the connection pad of the application processor chip 33a and the application processor chip 33b are formed. The wiring 44b is arranged substantially parallelly between the surface (lower surface) of the photosensitive resin layer 21 on the base substrate side and the surface (upper surface) opposite to the base substrate side. In the present embodiment, wiring photo vias 44aa and 44ab arranged on the inner surface and the bottom surface of the via holes 43a and 43b and the wiring 44b are integrally formed and electrically connected to each other in the depth direction which is not shown in the figure. With this configuration, the application processor chips 33a and 33b are electrically connected to each other through the copper wiring layer 44 in the re-distribution layer 42.

After forming the copper wiring layer 44, a film type photosensitive resin (dry film) having a thin insulating property is vacuum-laminated, whereby the inner surfaces of the wiring photo vias 44aa and 44ab arranged in the via holes 43a and 43b are easily filled with the photosensitive resin in the same process although the holes differ in depth. The photosensitive resin layer 21 is arranged inside the wiring photo vias 44aa and 44ab. Thus, the copper wiring layer 44 is completely embedded in the photosensitive resin layer 21 and its entire surface is substantially flattened. After the copper wiring layer 44 is formed, an insulating liquid photosensitive resin may be spin-coated or slit-coated on the surface of the photosensitive resin.

The re-distribution layer 42 is composed of a plurality of layers of the copper wiring layer 44, 46, 48 (the metallic wiring layer), and the copper wiring layer 44, 46, 48 may be electrically connected by the wiring photo vias 45, 47. The photosensitive resin layer 21 forms each layer by stacking photosensitive resins in the form of films that are thick in the first layer and thin in the second and subsequent layers. By subjecting each layer to heat and pressure treatment for each manufacturing process, an integrated resin layer is obtained by bonding without a boundary surface. For the second and subsequent thin layers, the photosensitive resin based on the same kind of resin material system in a liquid state can be stacked by spin-coating or slit-coating and subjected to a heat and pressure treatment. As described above, the photosensitive resin layer 21 forming the stacked layer has a strong interlayer coupling so that the boundary surface cannot be confirmed by the cross-sectional analysis. Although interlayer bonding is somewhat weakened, it is also possible to use the different material systems for the film type and liquid type photosensitive resins as long as the predetermined quality can be ensured.

The external connection terminal 49 is arranged on a surface (upper surface in the figure) opposed to the substrate 11. The external connection terminal 49 is arranged at a position not overlapping with the outer peripheral edge A of the application processor chips 33a and 33b. The re-distribution layer 42 may be connected to an external substrate or the like through the plurality of solder balls 51 connected to the external connection terminal 49. The solder ball 51 also does not overlap with the outer peripheral edge A of the application processor chips 33a and 33b. Generally, the wiring photo vias 44aa and 44ab do not overlap with the outer peripheral edge A of the application processor chips 33a and 33b. By arranging the external connection terminal 49, the solder ball 51, and the wiring photo vias 45, 46, and 47 so as not to overlap with the outer peripheral edge A of the application processor chips 33a and 33b, it is possible to suppress the effect of small steps that may occur above the outer peripheral edge A, and to improve the reliability of the semiconductor device 40.

The via holes 43a and 43b exposing the connection part (connection pad) of the application processor chips 33a and 33b are formed by the developing process for selectively irradiating the photosensitive resin with light and dissolving and removing the resin. Since the surface on which the connection parts of the application processor chips 33a and 33b are formed have different heights from the upper surface of the photosensitive resin layer 21, the depths of the via holes 43a and 43b are different. The aspect ratios of the via holes 43a and 43b are also different. However, it is preferable that the aspect ratios of the via holes 43a and 43b are 1.5 or less. When the aspect ratio of the via hole 43a and the via hole 43b are 1.5 or less, the connection reliabilities of the wiring photo via 44aa arranged in the via hole 43a and the wiring photo via 44ab arranged in a via hole 43b are improved. Since the wiring photo via 44aa or 44ab is inscribed in the via hole 43a or 43b, the aspect ratio of the wiring photo via 44aa or 44ab is substantially the same as the aspect ratio of the via hole 43a or 43b. As will be described later, the via holes 43a and 43b can be formed in the same process. Assuming that the thickness of the application processor chip 33a is 70 μm, the thickness of the application processor chip 33b is 50 μm, the thickness of the photosensitive resin layer 21 is 100 μm, the film thickness of the region overlapping with the surface on which the connection pads of the application processor chip 33a are formed is 30 μm, and the film thickness of the region overlapping with the surface on which the connection pads of the application processor chip 33b are formed is 50 μm, the aspect ratio of the via hole 43a is 1.0 and the aspect ratio of the via hole 43b is 1.25 when the diameter of the via hole 43a is 30 μm and the diameter of the via hole 43b is 40 μm.

The semiconductor device 40A configured as described above is also stored and may be distributed in some cases in the state of the semi-finished product in the form of being accumulated in the substrate 11.

<Mounting of the Semiconductor Device According to an Embodiment of the Present Invention>

Figure 20:
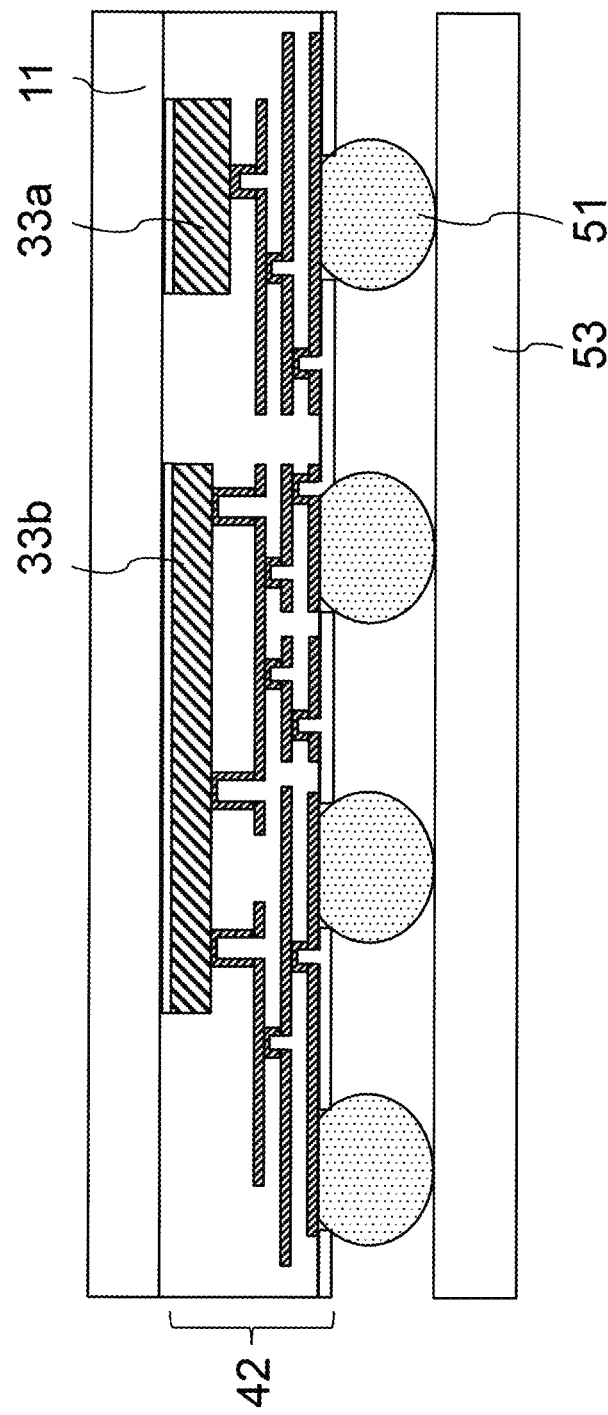
FIG. 20 is a cross-sectional view of a semiconductor device (after mounting) according to an embodiment of the present invention.

FIG. 20 is a cross-sectional view showing a state in which the semiconductor device according to an embodiment of the present invention is mounted on the print substrate 53 (semiconductor device 50A). The mounting method up to this stage will be described below.

The semi-finished product 2 shown in FIG. 19 is individualized using a dicing saw or the like. Before individualization, a test process such as an electrical characteristic may be performed. Even when individualized, the substrate 11 remains attached. The semiconductor device according to an embodiment of the present invention will be stored and distributed in an individualized form.

The print substrate 53 is mounted through the following steps. First, the individualized semiconductor device 40A is inverted upside down and mounted on the print substrate 53. The solder ball 51 is mounted for landing on an electrode land of the print substrate 53. Subsequently, hot air is blown (reflow process), whereby the solder ball 51 is melted and electrically connected to the electrode land of the print substrate 53.

<Modified Example of the Embodiments of the Invention>

Figure 21:
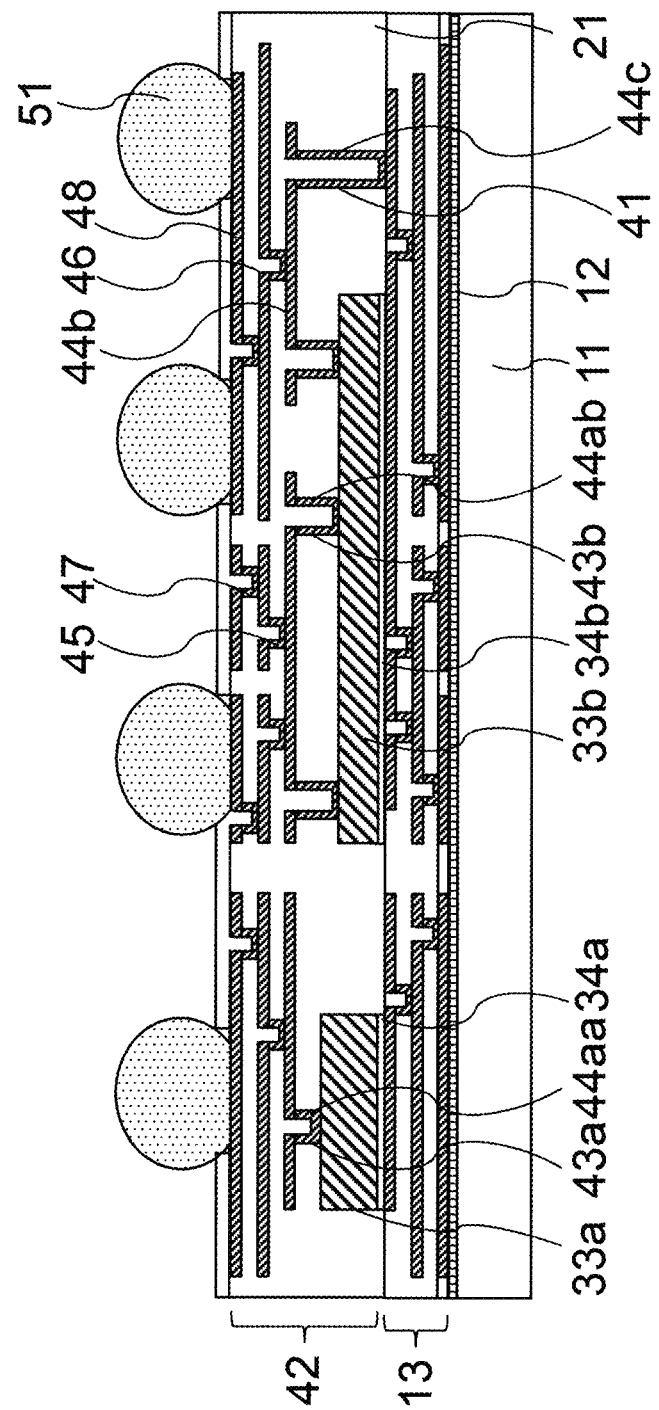
FIG. 21 is a cross-sectional view of a semiconductor device (semi-finished product 5) according to a modified example.

In FIG. 19, the base substrate has a configuration including the substrate 11. However, the present invention is not limited thereto, and as shown in FIG. 21, a semiconductor device 40A' may include the substrate 11, the release layer 12, and the wiring layer 13 as the base substrate. Though not shown in the drawing, the wiring layer 13 alone may be configured. The copper wiring layer 44 may include a wiring photo via 44c connected to the wiring layer 13 in the base substrate. With such configuration, the application processor chips 33a and 33b, the wiring layer 13, and the re-distribution layer 42 are three-dimensionally connected to each other through the copper wiring layer 44. Such semiconductor device 40A' becomes a part of a member for manufacturing the three-dimensional FOWLP 60.

Figure 22:
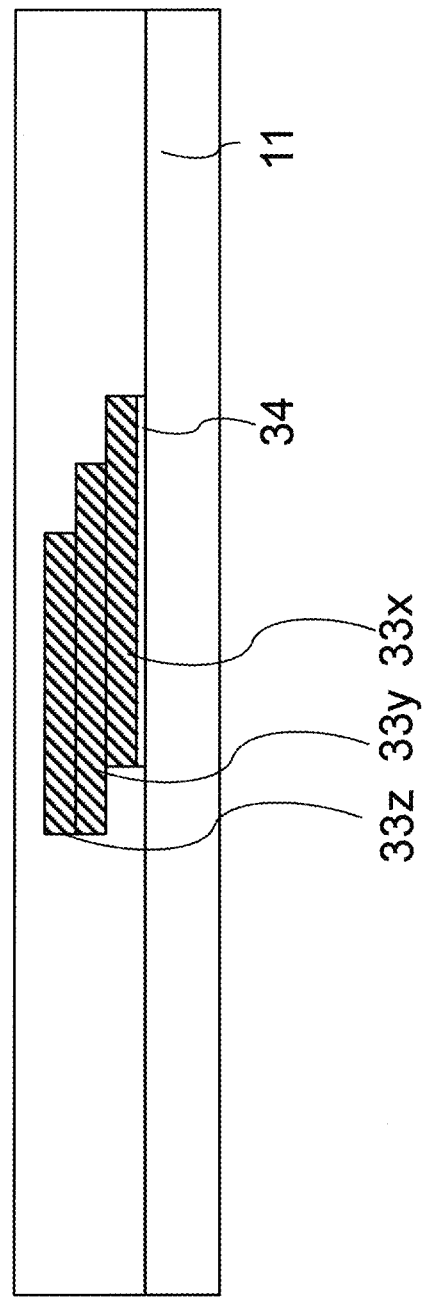
FIG. 22 is a cross-sectional view of a semiconductor device (semi-finished product 6) according to a modified example of the present invention.

In the semiconductor device 10A shown in FIG. 18, the application processor chips 33a and 33b are arranged side by side on the substrate 11. However, the present invention is not limited thereto, and as shown in FIG. 22, a memory chip 33x and 33y such as a NAND flash memory and a DRAM, and a storage controller chip 33z may be stacked and arranged in a stepped manner on the base substrate in the semiconductor device 10B. Depending on the requirements of the system integration, the memory chip may be further stacked in multiple stages. The reason for the stacking in the stepwise pattern is that the connection pad is not exposed by the simple stacked layer when the chip size is approximately the same, so that connection pad of the chip is exposed. When stacking smaller-sized chip on the upper stage, it is not necessary to stack them in a stepped manner if the connection pad is exposed. The semiconductor chip with a large number of connection pad (storage controller chips 33z in FIG. 22) is arranged in the uppermost layer because the connection in a shallow wiring photo via is superior to a high-speed transmission and a reduction of disconnection risk.

Figure 23:
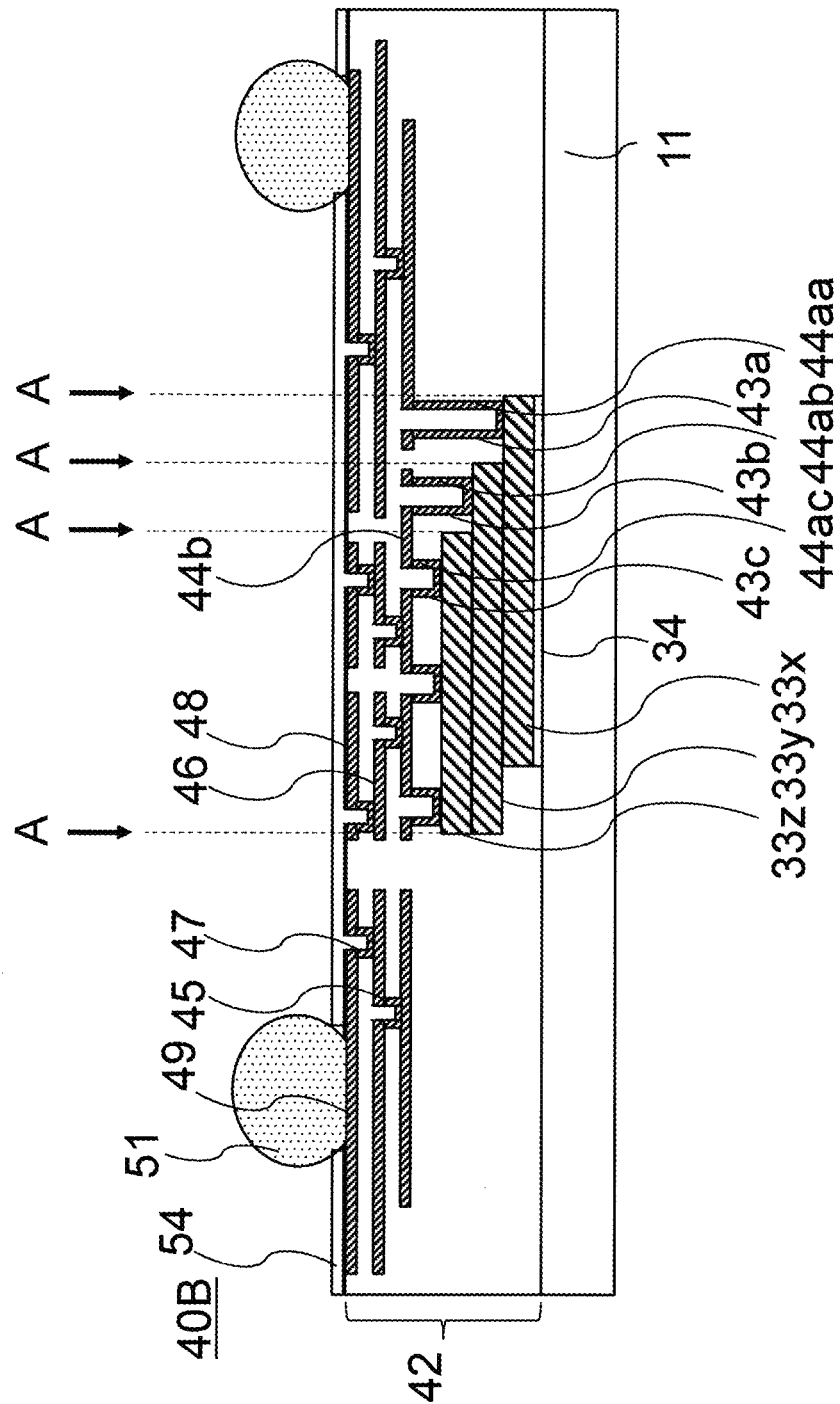
FIG. 23 is a cross-sectional view of a semiconductor device (semi-finished product 7) according to a modified example of the present invention.

FIG. 23 shows a semiconductor device 40B based on the semiconductor device 10B, in which the re-distribution layer 42 is formed on the photosensitive resin layer 21. The connection part (connection pad) of each of the memory chips 33x and 33y and the storage controller chip 33z are stacked in a stepwise manner so as not to overlap each other. All the memory chips 33x and 33y and the storage controller chip 33z are included in the resin by vacuum lamination process of the film type photosensitive resin (dry film), and the upper surface of the photosensitive resin is flattened by press processing. The vacuum lamination process allows sealing without forming air bubbles in the stepwise part where the connection pad is not provided. As a matter of course, the connection part of the memory chips 33x and 33y is provided so as to be arranged at an exposed position.

The thickness of the photosensitive resin layer 21 is 200 µm or less and is 10 µm to 50 µm thicker than the total thickness of the memory chips 33x and 33y and the storage controller chip 33z. In order to securely encapsulate the memory chips 33x and 33y and the storage controller chip 33z and to suppress the thickness thereof, the thickness of the photosensitive resin layer 21 at the region overlapping with the chip surface having the connection pad of the uppermost chip (in this case, the storage controller chip 33z) is preferably 5 µm or more and 50 µm or less.

The photosensitive resin layer 21 includes the via hole 43a, the via hole 43b, and the via hole 43c that expose the connection part (connection pad) of each of the memory chips 33x and 33y and the storage controller chip 33z. In the via holes 43a, 43b, and 43c, the wiring photo vias 44aa, 44ab, and 44ac are arranged. The photosensitive resin layer 21 is arranged inside the wiring photo vias 44 aa, 44ab, 44ac. This is because the inside of the wiring photo vias 44aa, 44ab, and 44ac are reliably filled with the photosensitive resin by vacuum lamination (or by spin-coating or slit-coating) the photosensitive resin in the process of forming the wiring layer in the next stage, as in the above-described embodiment.

The aspect ratio of the wiring photo via 44aa is larger than the aspect ratio of the wiring photo via 44ab, and the aspect ratio of the wiring photo via 44ab is larger than the aspect ratio of the wiring photo via 44ac. The wiring photo via 44aa, the wiring photo via 44ab, and the wiring photo via 44ac are electrically connected to the wiring 44b. With this configuration, the memory chips 33x, 33y, and the storage controller chip 33z, and the re-distribution layer 42 are electrically connected to each other through the copper wiring layer 44.

The wiring photo vias 44aa, 44ab, 44ac are located at the positions not overlapping with the outer peripheral edge A of the memory chips 33x, 33y and the storage controller chip 33z. The wiring photo vias 45 and 47 of the re-distribution layer 42 are also located at the positions not overlapping with the outer peripheral edge A of the memory chips 33x, 33y and the storage controller chip 33z. Preferably, the external connection terminal 49 is located at the positions not overlapping with the outer peripheral edge A of the memory chips 33x, 33y and the storage controller chip 33z. The solder ball 51 is also preferably located at the positions not overlapping with the outer peripheral edge A of the memory chips 33x, 33y and the storage controller chip 33z. Here, the outer peripheral edge A of the memory chips 33x, 33y and the storage controller chip 33z indicate all the outer peripheral edge A arranged in multiple stages that can be confirmed when viewed from above. Therefore, for example, both the wiring photo vias 45 and 47 and the external connection terminal 49 can be arranged on the part of the outer peripheral edge (left end of the memory chip 33x in FIG. 23) of the memory chip 33x covered by the memory chip 33y and the storage controller chip 33z in the upper stage.

Figure 24:
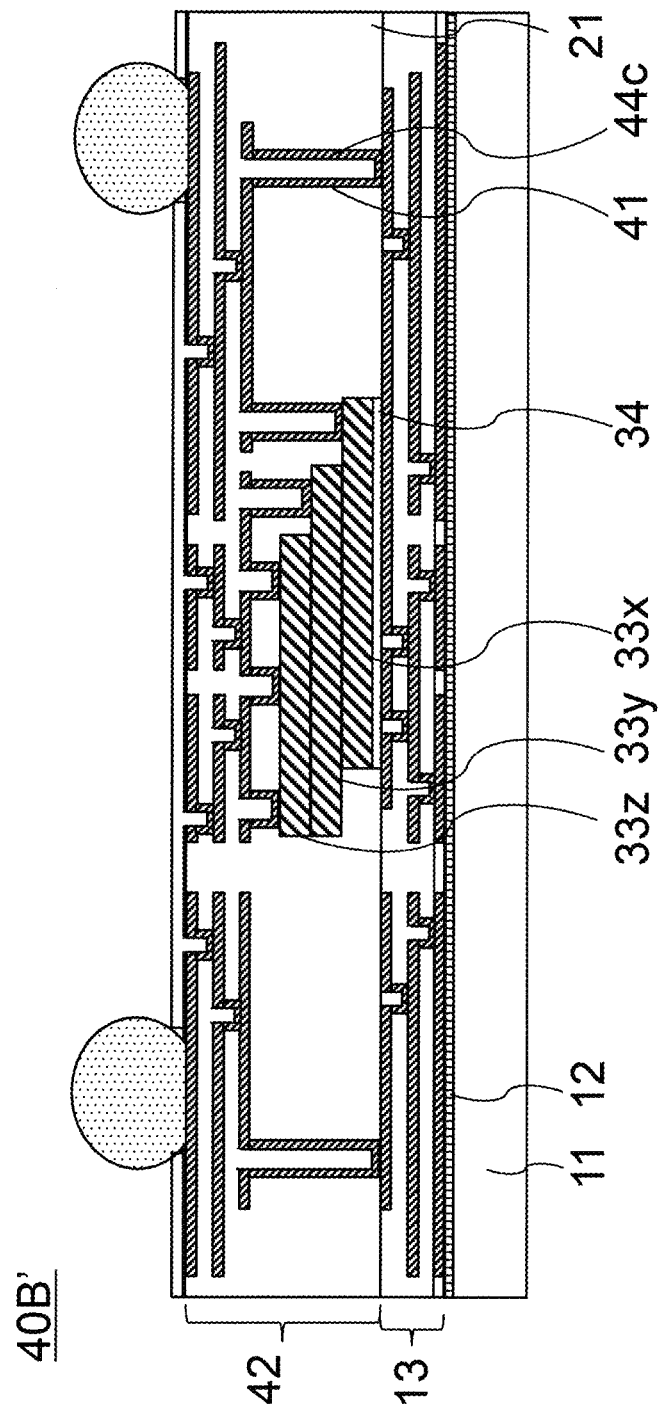
FIG. 24 is a cross-sectional view of a semiconductor device (semi-finished product 8) according to a modified example of the present invention.

In FIG. 23, the base substrate has a configuration including the substrate 11. However, the present invention is not limited thereto, and as shown in FIG. 24, a semiconductor device 40B' may include the substrate 11, the release layer 12, and the wiring layer 13 as the base substrate. Though not shown in the drawing, the wiring layer 13 alone may be configured. The copper wiring layer 44 may include the wiring photo via 44c connected to the wiring layer 13. With this configuration, the memory chips 33x and 33y and the storage controller/chip 33z, the wiring layer 13, and the re-distribution layer 42 are three-dimensionally connected to each other through the copper wiring layer 44.

It should be noted that the present invention is not limited to the above-mentioned embodiments and modified example, and can be appropriately modified within a range not deviating from the gist. In addition, each embodiment and modified example can be appropriately combined.

<The Electronic Information Terminal According to an Embodiment of the Present Invention>

The electronic information terminal (including a mobile telephone, a smart phone terminal, a tablet terminal, and the like, but not limited to them) according to an embodiment of the present invention includes at least one of the three-dimensional semiconductor device 60A, 60B, 40A, 40A', 40B, and 40B' mounted on a main print substrate of the terminal. The transmission distance between chips is short, the impedance is suppressed, and good large amount of data communication is possible. In one embodiment of the present invention, since the respective semiconductor chip can be mounted in the staked layer, and the mounting region can be reduced, so that the miniaturized electronic information terminal can be realized.

In one embodiment of the present invention, although an example of three-dimensionally mounting the application processor chip, DRAM, and the flash memory has been shown, the electronic circuit element is not limited thereto, and other logic LSI or memory element may be used instead of the application processor chip, and other memory element or logic LSI, discrete, analogue, or RF element may be used instead of DRAM or flash memory. The electronic circuit element is not limited to the semiconductor device, but may be elements that can be components of various electronic circuits, such as passive elements, sensor elements, magnetic devices, antennas, etc.

What is claimed is:

1. An electronic circuit device comprising:
a base substrate having a wiring layer;
at least one first electronic circuit element having a first surface fixed to the base substrate and having a connection part on a second surface opposed to the first surface;
a re-distribution layer including a photosensitive resin layer, the photosensitive resin layer having insulation properties, the photosensitive resin layer enclosing the first electronic circuit element on the base substrate and embedding a first wiring photo via, a second wiring photo via, and a wiring, the first wiring photo via electrically connected to the connection part of the first electronic circuit element, the second wiring photo via arranged at the outer periphery of the first electronic circuit element and electrically connected to a connection part of the wiring layer, the wiring arranged on the second surface and electrically connected to the first wiring photo via and the second wiring photo via; and
an external connection terminal arranged on the re-distribution layer, the external connection terminal electrically connected to the first electronic circuit element through the first wiring photo via and the wiring; wherein,
inside of the first wiring photo via and the second wiring photo via are filled with the photosensitive resin layer, an aspect ratio of the first wiring photo via is smaller than an aspect ratio of the second wiring photo via, and the aspect ratio of the first wiring photo via is 1.5 or less, and
the external connection terminal is arranged at a position which does not overlap with an outer peripheral end of the first electronic circuit element.

2. The electronic circuit device according to claim 1, wherein,
the number of the first wiring photo via is larger than the number of the second wiring photo via.

3. The electronic circuit device according to claim 1, the electronic circuit device further comprising:
a second electronic circuit element fixed to the base substrate alongside the first electronic circuit element and having a connection part on a surface opposed to the surface on the base substrate side; wherein,
the re-distribution layer further includes a third wiring photo via, the third wiring photo via is electrically connected to the connection part of the second electronic circuit element,
the wiring electrically connects the first wiring photo via or the second wiring photo via and the third wiring photo via, and
inside of the third wiring photo via is filled with the photosensitive resin layer.

4. The electronic circuit device according to claim 3, wherein,
a thickness of the second electronic circuit element is thinner than a thickness of the first electronic circuit element, and
an aspect ratio of the third wiring photo via is 1.5 or less, and the aspect ratio of the third wiring photo via is larger than an aspect ratio of the first wiring photo via.

5. The electronic circuit device according to claim 1, the electronic circuit device further comprising:

a third electronic circuit element fixed to the second surface of the first electronic circuit element so as to expose the connection part of the first electronic circuit element, the third electronic circuit element having a connection part on a surface opposed to the surface on the first electronic circuit element side; wherein,
the re-distribution layer further includes a fourth wiring photo via, the fourth wiring photo via is electrically connected to the connection part of the third electronic circuit element,
the wiring electrically connects the first wiring photo via and the fourth wiring photo via, and
inside of the fourth wiring photo via is filled with the photosensitive resin layer.

6. The electronic circuit device according to claim 5, wherein,
an aspect ratio of the fourth wiring photo via is 1.5 or less, and the aspect ratio of the fourth wiring photo via is smaller than an aspect ratio of the first wiring photo via.

7. The electronic circuit device according to claim 5, wherein,
at least one of the third electronic circuit element is arranged stepwise on the first electronic circuit element.

8. The electronic circuit device according to claim 1, wherein,
the photosensitive resin layer has a film thickness on a region overlapping the second surface of the first electronic circuit element and a film thickness on the third electronic circuit element of 5 μm or more and 50 μm or less.

9. The electronic circuit device according to claim 1, wherein,
the photosensitive resin layer is a silicone-based or a bismaleimide-based resin, and the photosensitive resin layer has an elastic modulus of 1 GPA or less at normal temperature (room temperature) and 0.1 GPA or less at 125° C.

10. The electronic circuit device according to claim 3, the electronic circuit device further comprising:
a third electronic circuit element fixed to the second surface of the first electronic circuit element so as to expose the connection part of the first electronic circuit element, the third electronic circuit element having a connection part on a surface opposed to the surface on the first electronic circuit element side; wherein,
the re-distribution layer further includes a fourth wiring photo via, the fourth wiring photo via is electrically connected to the connection part of the third electronic circuit element,
the wiring electrically connects the first wiring photo via and the fourth wiring photo via, and
inside of the fourth wiring photo via is filled with the photosensitive resin layer.

11. A method of manufacturing an electronic circuit device for packaging an electronic circuit element, the method comprising:
fixing a first surface of at least one electronic circuit element to a base substrate having a wiring layer (first step);
forming a first photosensitive resin layer by covering the electronic circuit element and flattening an upper surface of the first photosensitive resin layer using a film type photosensitive resin thicker than the thickness of the electronic circuit element (second step);
curing the first photosensitive resin layer after pre curing the first photosensitive resin layer and forming a first via hole and a plurality of second via hole simultaneously by selectively irradiating the first photosensitive resin layer other than a region overlapping the outer peripheral end of the electronic circuit element with light, the first via hole exposing a connection part arranged on a second surface of the electronic circuit element opposed to the first surface, and the plurality of second via hole arranged around the electronic circuit element to expose a connection part of the wiring layer (third step);

forming a wiring pattern and a metal film together, the wiring pattern arranged on a surface of the first photosensitive resin layer, and the metal film electrically connecting the wiring pattern, the inner surface of the first via hole, and the inner surface of the second via hole (fourth step);

forming a second photosensitive resin on the first photosensitive resin to filling the internal space of the first via hole and the second via hole and flattening the upper surface of the second photosensitive resin by stacking a film type photosensitive resin thinner than the first photosensitive resin layer on the first photosensitive resin layer (fifth step); and curing the second photosensitive resin layer and adhering the first photosensitive resin layer and the second photosensitive resin layer after pre curing the second photosensitive resin layer and forming a via hole exposing a part of the wiring pattern by selectively irradiating the second photosensitive resin layer other than a region overlapping the outer peripheral end of the electronic circuit element with light (sixth step).

12. The method of manufacturing an electronic circuit device according to claim 11, wherein,
a plurality of electronic circuit element having different thicknesses are fixed to the base substrate respectively,
a plurality of via holes each exposing the connection parts of the plurality of electronic circuit element are simultaneously formed by selectively irradiating the first photosensitive resin layer other than the region overlapping the outer peripheral end of the plurality of electronic circuit element with light, and
an aspect ratio of a via hole arranged on a thick electronic circuit element is 1.5 or less, the aspect ratio of the via hole arranged on the thick electronic circuit element is smaller than an aspect ratio of a via hole arranged on a thin electronic circuit element.

13. The method of manufacturing an electronic circuit device according to claim 11, the method further comprising:
stacking a plurality of electronic circuit element stepwise so as to expose the respective connection parts on the base substrate (7th step); and
forming a plurality of via hole each exposing the connection part of the plurality of electronic circuit element simultaneously by selectively irradiating the first photosensitive resin layer other than the region overlapping the outer peripheral end of the plurality of electronic circuit element with light (8th step); wherein,
an aspect ratio of a via hole exposing a connection part of an electronic circuit element far from the base substrate is smaller than an aspect ratio of an via hole exposing a connection part of an electronic circuit element close to the base substrate, and the aspect ratio of the via hole exposing the connection part of the electronic circuit element far from the base substrate is 1.5 or less.

14. The method of manufacturing an electronic circuit device according to claim 11, the method further comprising:
forming a third photosensitive resin layer by stacking a film type photosensitive resin on the second photosensitive resin layer on which a wiring pattern is formed,
curing the third photosensitive resin layer after pre curing the third photosensitive resin layer and forming a via hole exposing a part of the wiring pattern by selectively irradiating the third photosensitive resin layer other than the region overlapping the outer peripheral end of the electronic circuit element with light (ninth step).

15. An electronic circuit device comprising:
a base substrate;
a re-distribution layer including a photosensitive resin layer, the photosensitive resin layer having insulation properties, the photosensitive resin layer integrally enclosing a plurality of electronic circuit elements on the base substrate and embedding a plurality of wiring photo vias, and a wiring, each of the plurality of electronic circuit elements having a first surface fixed to the base substrate and having a connection part on a second surface opposed to the first surface, the plurality of electronic circuit elements having different element thicknesses, the plurality of wiring photo vias electrically connected to the connection part of the plurality of electronic circuit elements, the wiring arranged so as to be orthogonal to the plurality of wiring photo vias and electrically connected to the plurality of wiring photo vias; and
an external connection terminal arranged on the re-distribution layer, the external connection terminal electrically connected to the plurality of electronic circuit element through the plurality of wiring photo vias and the wiring; wherein,
inside of the plurality of wiring photo vias are filled with the photosensitive resin layer, an aspect ratio of the plurality of wiring photo vias is 1.5 or less,
a length of the wiring photo via connected to the connection part of the electronic circuit element having a small element thickness is larger than a length of the wiring photo via connected to the connection part of the electronic circuit element having a large element thickness, and
the external connection terminal is arranged at a position which does not overlap with an outer peripheral end of the plurality of electronic circuit element.

16. The electronic circuit device according to claim 15, wherein,
the photosensitive resin layer is a silicone-based or a bismaleimide-based resin, and the photosensitive resin layer has an elastic modulus of 1 GPA or less at normal temperature (room temperature) and 0.1 GPA or less at 125° C.

* * * * *